(12) United States Patent
Miyagawa et al.

(10) Patent No.: US 7,071,529 B2
(45) Date of Patent: Jul. 4, 2006

(54) SEMICONDUCTOR DEVICE HAVING A DAMASCENE GATE OR A REPLACING GATE

(75) Inventors: Kazuhiro Miyagawa, Ibaraki (JP); Mitsuo Yasuhira, Ibaraki (JP); Yasushi Akasaka, Ibaraki (JP); Isamu Nishimura, Shizuoka (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 10/863,395

(22) Filed: Jun. 9, 2004

(65) Prior Publication Data
US 2005/0001267 A1 Jan. 6, 2005

(30) Foreign Application Priority Data
Jul. 4, 2003 (JP) ............................. 2003-192418

(51) Int. Cl.
*H01L 29/00* (2006.01)

(52) U.S. Cl. ...................... 257/501; 257/506; 257/510; 257/513

(58) Field of Classification Search ................ 257/374, 257/501, 506, 510, 513
See application file for complete search history.

(56) References Cited

U.S. PATENT DOCUMENTS

| 6,351,019 B1 * | 2/2002 | DeBrosse et al. ........... 257/510 |
| 6,433,438 B1 | 8/2002 | Koubuchi et al. |
| 2002/0043683 A1 | 4/2002 | Nakagawa et al. |

FOREIGN PATENT DOCUMENTS

JP       2001-102443       4/2001

OTHER PUBLICATIONS

A. Yagishita, et al., "High Performance Metal Gate MOSFETs Fabricated by CMP for 0.1 μm Regime", Proceedings of IEDM Tech. Dig. (1998), pp. 785-788.
A. Chatterjee, et al., "Sub-100nm Gate Length Metal Gate NMOS Transistors Fabricated by a Replacement Gate Process", Proceedings of IEDM Tech. Dig. (1997), pp. 821-824.

* cited by examiner

*Primary Examiner*—Thien F. Tran
(74) *Attorney, Agent, or Firm*—Leydig, Voit & Mayer, Ltd.

(57) ABSTRACT

A semiconductor device includes semiconductor elements and at least one dummy pattern. Each or at least some of the semiconductor elements has a Damascene gate structure or a replacing gate structure and is located in element-forming regions. In addition, at least a dummy pattern is located in a region different from the element-forming regions. The dummy pattern may have a semiconductor element structure of the same or different kind from the Damascene gate structure or replacing gate structure. The dummy pattern may be a pattern of an insulating film, an interface transistor, or an analog circuit capacitor electrode instead of the dummy gate.

2 Claims, 22 Drawing Sheets

PRIOR ART

SEMICONDUCTOR DEVICE HAVING A DAMASCENE GATE OR A REPLACING GATE

FIELD OF THE INVENTION

The present invention relates to structures of semiconductor devices and methods of manufacturing the semiconductor devices, and more particularly, to the structures of Damascene-type gates and replacing-type gates and the methods of manufacturing thereof.

BACKGROUND ART

With miniaturization of LSI, thinning of a gate insulating film has been in progress, and decreasing in gate capacitance owing to depletion of a polysilicon gate electrode cannot be disregarded. To solve this problem, there has been suggested substitution by a metallic gate electrode that is free from depletion (for example, refer to Japanese unexamined laid-open patent publication No. 2001-102443).

Generally, a source/drain is formed after formation of a gate electrode. However, compared to polysilicon, metal is much reactive to a silicon oxide film and a high-dielectric film such as $Al_2O_3$ or $HfO_2$. Therefore, it is proposed to form a gate electrode after formation of a source/drain that needs high temperature treatment. These gates are called 'Damascene-type gates' or 'replacing-type gates' (for example, refer to A. Yagishita et al., IEDM Tech. Dig. (1998), pp.785–788, or A. Chatterjee et al., IEDM Tech. Dig. (1997), pp. 821–824).

FIGS. 44 to 54 are process diagrams for sequentially illustrating a conventional method for manufacturing a Damascene-type gate device and a replacing-type gate device.

First, as shown in FIG. 44, an element isolation 6a, a P-type well 8 and an N-type well 10 are formed on a semiconductor substrate 1. Then, a dummy gate oxide film 11 and a polysilicon film 12 are formed.

Next, as shown in FIG. 45, a resist pattern is formed using lithography, and dry-etching is carried out using the resist pattern as a mask, and dummy gates 12a are formed.

Next, as shown in FIG. 46, by lithography and ion implantation, a low concentration diffusion region 15 (hereinafter referred to as extension) of the NMOS, a pocket ion implantation region 16 (hereinafter referred to as halo) of the NMOS, and an extension 17 and a halo 18 of the PMOS are formed.

Next, as shown in FIG. 47, spacers 19 composed of a silicon nitride film are formed, and as FIG. 48 shows, a source/drain 20 for the NMOS and a source/drain 21 for the PMOS are formed.

Next, as shown in FIG. 49, a contact-etch stopper film 22 composed of a silicon nitride, film and an interlayer insulating film 23 composed of a silicon oxide film are formed.

Next, as shown in FIG. 50, the interlayer insulating film 23 and the contact-etch stopper film 22 are polished by chemical mechanical polishing (hereinafter referred to as CMP), and the upper surface of the dummy gates 12a is exposed.

Next, as shown in FIG. 51, gate trenches 25 are formed by removing the dummy gates 12a and the dummy gate oxide films 11 (refer to FIG. 50).

Next, as shown in FIG. 52, a gate insulating film 26 composed of a high-dielectric-constant insulating film such as $Al_2O_3$, $HfO_2$, $ZrO_2$ or the like, or composed of $SiO_2$, SiN or the like, is formed so as to coat the inside of the gate trenches 25 (refer to FIG. 51). Then, a first metal film 27 composed of TiN or the like is formed. The first metal film determines the threshold value of the MOSFET, thus the material of the first metal film is chosen with consideration to work function and reactivity to the high-dielectric-constant film.

Further, so as to bury the trench, a second metal film 28 is deposited therein. The second metal is deposited so as to decrease the resistance of the electrodes, and material such as W, Al, Cu, or the like, which are used in normal wirings, would be sufficient.

Next, as shown in FIG. 53, in the case where a Damascene-type gate is to be formed, the Damascene-type gate 29 is formed by removing, using CMP, the second metal film 28, the first metal film 27 and the gate insulating film 26 that are deposited outside the gate trenches 25 (refer to FIG. 51).

Alternatively, in the case where a replacing-type gate electrode is to be formed, as shown in FIG. 54, instead of the process of FIG. 53, a resist pattern (not shown) is formed using lithography; the second metal film 28, the first metal film 27, and the gate insulating film 26 are selectively etched by dry etching using the resist pattern as a mask; and the replacing-type gate is formed.

Thereafter, interlayer insulating films are deposited on the Damascene-type gate or the replacing-type gate; and contacts and wirings are formed (graphic representation not given).

Now, FIG. 55 shows a sectional view of a conventional Damascene-gate type semiconductor device in a manufacturing process prior to CMP process for exposing the upper surface of the dummy gates. FIG. 56 shows a sectional view of a semiconductor device in a manufacturing process after CMP process for exposing the upper surface of the dummy gates. (FIG. 55 corresponds to the aforementioned process of FIG. 49, and FIG. 56 corresponds to the aforementioned process of FIG. 50 of the background art).

As shown in FIG. 55, the device includes regions 7, 9 and 14 on a P-type silicon substrate 1. In FIG. 55, the device includes, on a P-type silicon substrate 1, a region 7 on which an N-channel transistor is formed (hereinafter referred to as the N-ch region) and a region 9 on which a P-channel transistor is formed (hereinafter referred to as the P-ch region). Dummy gates 12a are formed respectively on the N-ch region 7 and on the P-ch region 9. The device includes a region 14 on which a dummy gate is not formed. Further, the device includes an element isolation 6a, a P-type well 8, an N-type well 10, a dummy gate oxide film 11, a contact-etch stopper film 22 and an interlayer insulating film 23.

As shown in FIG. 56, when the upper surface of the dummy gates 12a are exposed by CMP, the thickness of the interlayer insulating film 23 becomes thin after CMP due to dishing in the region 14 on which a gate for a transistor is not formed. As a result, a recess 35 appears. This is because the polishing speed of the contact-etch stopper film 22 and that of the interlayer insulating film 23 are different from each other.

Thereafter, as for the Damascene-type gate device, gate trenches are formed by selectively removing the dummy gates 12a and the dummy gate oxide film 11 formed under the dummy gates 12a. Then, a gate insulating film and a metal film are formed so as to fill the gate trenches, and the portion thereof formed outside the gate trench is removed again by CMP.

At this time, as shown in FIG. 57, the metal film 35a remains on the recess 35 (refer to FIG. 56), and short-circuiting of wirings is caused and change in interlayer capacitance occurs. Also, since CMP depends on the pattern or the occupation density of the dummy gates, control of the polishing amount becomes difficult.

Furthermore, also in the replacing-type gate device, a metal film may remain in a recess of an interlayer insulating film in a process for forming a contact plug, and the same problems as those in the Damascene-type gate device may arise.

SUMMARY OF THE INVENTION

As described above, in the background art, in a method of manufacturing a semiconductor device having a Damascene-type gate or a replacing-type gate structure, a metal film might remain on the dishing portion in the region in which a dummy gate is not formed, and short-circuiting of wirings and the like might be caused.

The present invention has been devised to solve the above-mentioned problems in the background art, and the purpose of the present invention is to provide a semiconductor device having a Damascene-type gate or a replacing-type gate and is free from short-circuiting of wirings or the like. Furthermore, another purpose of the present invention is to provide a method for manufacturing a semiconductor device having a Damascene-type gate or a replacing-type gate wherein no dishing due to CMP occurs on the substrate during the process of exposing the dummy gate of the semiconductor device.

One feature of the present invention is that, in a semiconductor device having a Damascene-type gate electrode or a replacing-type gate electrode, an additional dummy gate, an interface (hereinafter referred to as I/O) transistor, or an electrode of the analog circuit capacitor is arranged in positions other than positions where a Damascene-type gate or a replacing-type gate is formed.

According to the above-mentioned structure and method, the difference in gate pattern density on the substrate is minimized, and dishing does not occur during the CMP process in which the upper surface of the dummy gates is exposed.

According to one aspect of the present invention, a semiconductor device comprises a plurality of semiconductor elements and a dummy pattern. The plurality of semiconductor elements is formed in element-forming regions, and has a Damascene-type gate structure or a replacing-type gate structure. The dummy pattern is formed in a region other than the element-forming regions.

According to another aspect of the present invention, a semiconductor device comprises a plurality of semiconductor elements and a pattern having another circuit element structure. The plurality of semiconductor elements is formed in element-forming regions, and the semiconductor element has a Damascene-type gate structure or a replacing-type gate structure. The pattern has another circuit element structure different from the Damascene-type gate structure or replacing-type gate structure formed in a region other than the element-forming regions.

According to another aspect of the present invention, in method of manufacturing a semiconductor device, a dummy gate oxide film is formed on a major surface of a semiconductor substrate. A first dummy gate is formed on a first place for forming a Damascene-type gate electrode or replacing-type gate electrode on the dummy gate oxide film, and a second dummy gate is formed on a second place other than the first place, respectively. A contact-etch stopper film is formed on each of the dummy gates. An interlayer insulating film is formed on the contact-etch stopper films. The interlayer insulating film and the contact-etch stopper film are polished by chemical mechanical polishing to expose upper surfaces of the dummy gates. The first dummy gates and dummy-gate oxide film thereunder are selectively removed to form a gate trench. A high-dielectric-constant gate insulating film is formed on the major surface of the semiconductor substrate so as to coat the inner surface of the gate trench. An electrode film is formed on the high-dielectric-constant gate insulating film so as to bury the gate trench. Further, The electrode film and the high-dielectric-constant gate insulating film outside of the gate trench are removed to form a Damascene-type gate electrode. Alternatively, the electrode film and the high-dielectric-constant gate insulating film outside the area wider than the gate trench are removed to form a replacing-type gate electrode leaving an electrode wider than the gate trench.

According to another aspect of the present invention, in a method of manufacturing a semiconductor device, a dummy -gate oxide film and a dummy gate are formed at a position for forming a Damascene-type gate electrode or a replacing-type gate electrode on a major surface of a semiconductor substrate. A stopper film for chemical mechanical polishing is formed on the major surface of the semiconductor substrate in a thickness close to the thickness of the dummy gate. A determined thickness of the stopper film is selectively etched to form a dummy pattern of the stopper film at a position other than the gate-forming position, leaving a certain thickness of the stopper film outside of the dummy pattern for chemical mechanical polishing. An interlayer insulating film is formed on the dummy pattern and the stopper film for chemical mechanical polishing. The interlayer insulating film and the stopper film is removed by chemical mechanical polishing to expose upper surface of the dummy gates. The dummy gate and dummy-gate oxide film thereunder are selectively removed to form a gate trench. A high-dielectric-constant gate insulating film is formed on the major surface of the semiconductor substrate to coat the inner surface of the gate trench. An electrode film is formed on the high-dielectric-constant gate insulating film so as to bury the gate trench. Further, the electrode film and the high-dielectric-constant gate insulating film out of the gate trench is removed to form a Damascene-type gate electrode. Alternatively, the electrode film and the high-dielectric-constant gate insulating film are removed from the area wider than the gate trench to form a replacing-type gate electrode leaving an electrode wider than the gate trench.

According to another aspect of the present invention, in a method of manufacturing a semiconductor device, a gate oxide film is formed on a major surface of a semiconductor substrate. A dummy gate is formed on a first place for forming a Damascene-type gate electrode or a replacing-type gate electrode, and an interface transistor electrode is formed on a second place other than the first place. A contact-etch stopper film is formed on the dummy gate and on the interface transistor electrode. An interlayer insulating film is formed on the contact-etch stopper film. The interlayer insulating film is polished by chemical mechanical polishing and the upper surface of the dummy gate is exposed. The dummy gate and the dummy-gate oxide film thereunder are selectively removed to form a gate trench. A high-dielectric-constant gate insulating film is formed on the major surface of the semiconductor substrate to coat the inner surface of the gate trench. An electrode film is formed on the high-dielectric-constant gate insulating film so as to bury the gate trench. Further, the electrode film and the high-dielectric-constant gate insulating film outside of the gate trench are removed to form a Damascene-type gate electrode. Alternatively, the electrode film and the highdielectric-constant gate insulating film outside the area wider than the gate trench are removed to form a replacing-type gate electrode leaving an electrode wider than the gate trench.

According to another aspect of the present invention, in a method of manufacturing a semiconductor device, a dummy gate oxide film is formed on a major surface of a semiconductor substrate. A dummy gate is formed on a first place for forming a Damascene-type gate electrode or a replacing-type gate electrode, and a capacitor electrode is formed on a second place other than the first place. A contact-etch stopper film is formed on the dummy gate and on the capacitor electrode. An interlayer insulating film is formed on the contact-etch stopper film. The interlayer insulating film and the contact-etch stopper film are polished by chemical mechanical polishing, and the upper surface of the dummy gate and the capacitor electrode is exposed. The dummy gate and dummy-gate oxide film thereunder are removed to form a gate trench. A high-dielectric-constant gate insulating film is formed to coat the inner surface of the gate trench and to coat the surface of the capacitor electrode. An electrode film is formed on the high-dielectric-constant gate insulating film so as to bury the gate trench. Further, the electrode film and the high-dielectric-constant gate insulating film outside of the gate trench are removed to form a Damascene-type gate electrode. Alternatively, the electrode film and the high-dielectric-constant gate insulating film outside the area wider than the gate trench are removed to form a replacing-type gate electrode leaving an electrode wider than the gate trench.

These and other objects, features, and advantages of the present invention will become more apparent in light of the following detailed description thereof, as illustrated in the accompanying drawings.

DETAILED DESCRIPTION OF THE PREFERRED EMBODIMENTS

Figure 1:
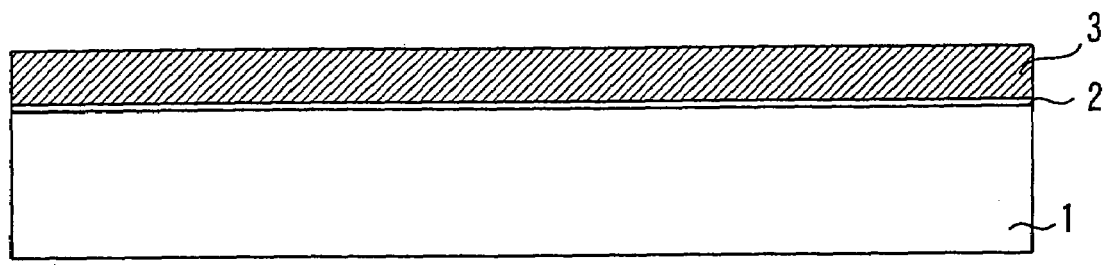
FIGS. 1 to 16 are process diagrams illustrating sequential steps of a method for manufacturing a semiconductor device according to a first embodiment of the present invention, and show sectional views of a semiconductor device.

The preferred embodiments of the present invention will be described below referring to the drawings.

First Embodiment

FIGS. 1 to 16 are process diagrams for sequentially illustrating a method for manufacturing a semiconductor device according to a first embodiment of the present invention, and show sectional views of a semiconductor device.

In manufacturing a semiconductor device, a P-type silicon substrate or an N-type silicon substrate is alternatively used. In this embodiment, a P-type silicon substrate is used. To form element isolation, a so-called selective oxidation method (LOCOS) may be carried out after coating the element region with a silicon nitride film or a shallow trench isolation method (STI). Here, an example using STI is shown.

First, as shown in FIG. 1, a buffer thermal oxide film 2 of a thickness of 20 nm is formed on the major surface of a P-type silicon substrate 1 using a vertical diffusion furnace, and a silicon nitride film 3 of a thickness of 150 nm is formed on the buffer thermal oxide film 2 using low-pressure chemical vapor deposition (LPCVD).

Next, a resist pattern (not shown) is formed on the silicon nitride film 3 using lithography, and the silicon nitride film 3 and the buffer thermal oxide film 2 are selectively etched using the resist pattern as a mask.

Figure 2:
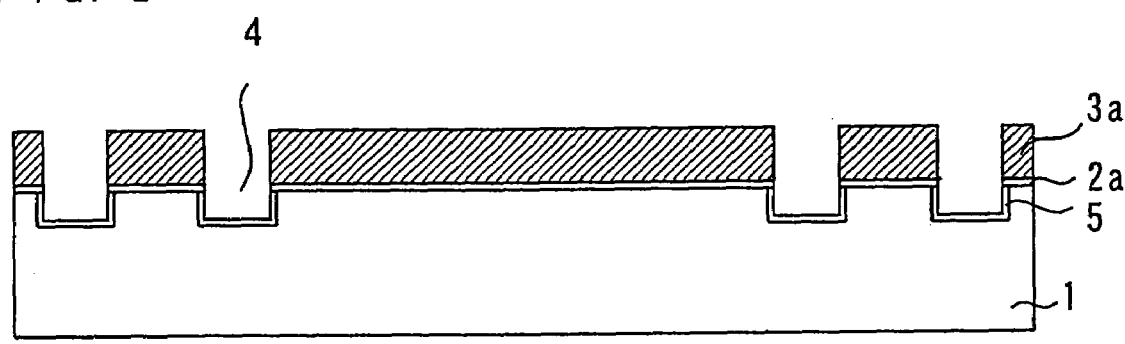

Next, as shown in FIG. 2 shows, trenches 4 of a depth of about 350 nm are formed in the P-type silicon substrate 1 by reactive ion etching using the selectively-etched silicon nitride film 3a and the buffer thermal oxide film 2a as masks. Next, the silicon internal walls of the trenches 4 are oxidized in a diluted oxygen atmosphere at 1100° C. for removing a plasma-damaged layer formed on the internal walls, and a liner oxide film 5 of a thickness of 20 nm is formed using a vertical diffusion furnace.

Figure 3:
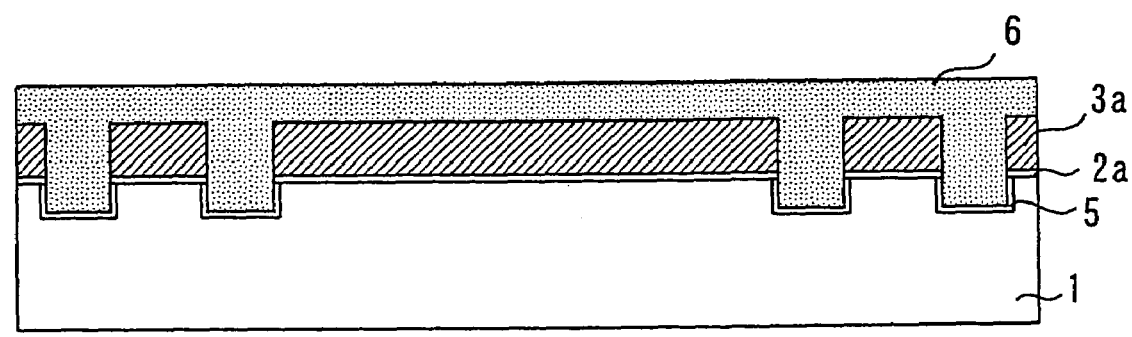

Next, as shown in FIG. 3, a burying oxide film 6 of a thickness of 600 nm is formed using high-density plasma CVD so as to bury the trench 4 (refer to FIG. 2). At this time, the film thickness is determined so that the trenches 4, the selectively-etched silicon nitride film 3a and the buffer thermal oxide film 2a (refer to FIG. 2) are entirely buried in the burying oxide film 6 and a sufficient flatness can be obtained by the CMP performed in the next step.

Figure 4:
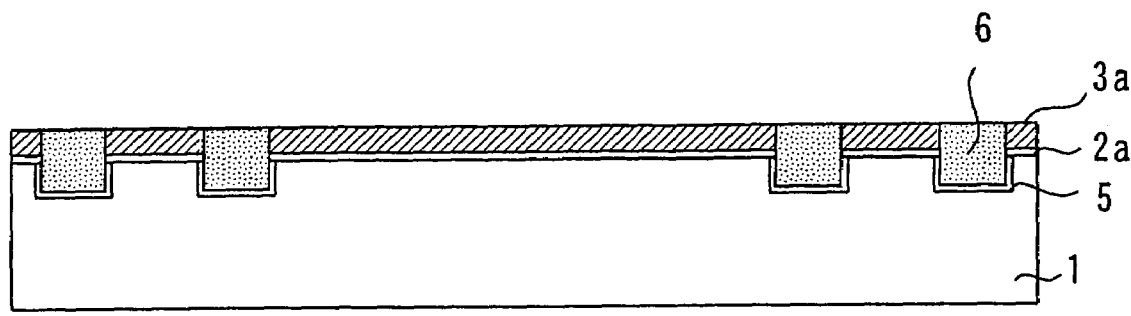

Next, as shown in FIG. 4, the burying oxide film 6 is polished using CMP to expose the upper surface of the silicon nitride film 3a.

Figure 5:
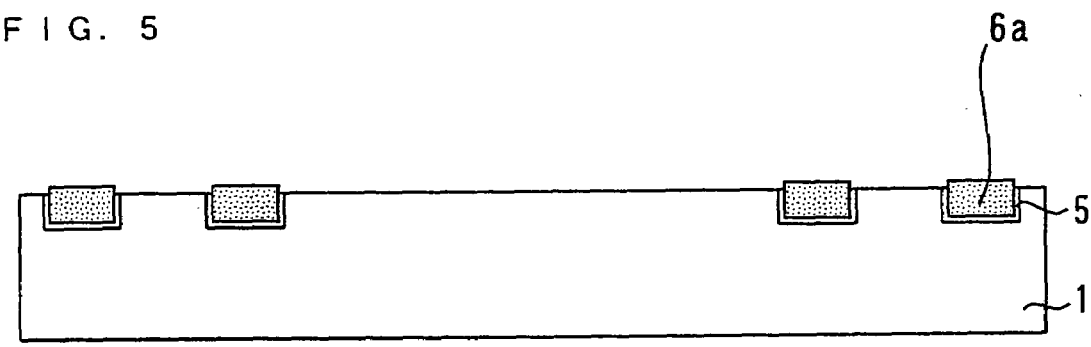

Next, as shown in FIG. 5, the silicon nitride film 3a (refer to FIG. 4) is completely removed using hot phosphoric acid, and the buffer thermal oxide film 2a (refer to FIG. 4) is completely removed using diluted aqueous solution of hydrofluoric acid to form an element isolation 6a.

Next, a resist pattern (not shown in FIG. 5) is formed using lithography on a location other than the P-type Well forming region, and ions of a P-type impurity are implanted using the resist pattern as the mask. In order to make the impurity content in the well uniform, ion implantation is divided into three steps. In the first step, boron is implanted under the conditions of an accelerating voltage of 400 keV and a dose of $5\times10^{12}$ cm$^{-2}$; in the second step, boron is implanted under the conditions of an accelerating voltage of 250 keV and a dose of $5\times10^{12}$ cm$^{-2}$; and in the third step, boron is implanted under the conditions of an accelerating voltage of 40 keV and a dose of $5\times10^{12}$ cm$^{-2}$.

Figure 6:
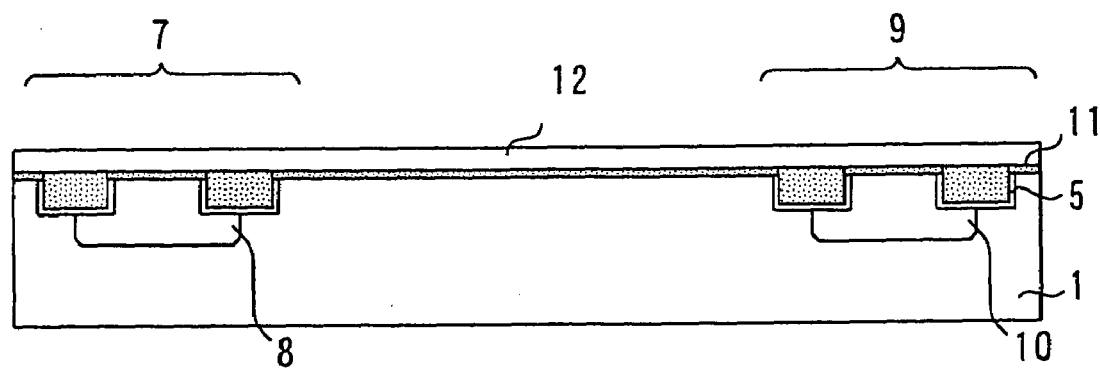

In order to control the threshold voltage of the N-ch transistor, the ion implantation of boron is performed under the conditions of an accelerating voltage of 20 keV and a dose of $5\times10^{12}$ cm$^{-2}$, and as shown in FIG. 6, a P-type well 8 is formed in a region 7 in which an N-channel transistor is to be formed (hereinafter referred to as the N-ch region 7).

Next, a resist pattern (not shown in FIG. 6) is formed using lithography on a location other than the N-type well forming region, and ions of an N-type impurity are implanted using the resist pattern as the mask. In order to make the impurity content in the well uniform, ion implantation is divided into three steps. In the first step, phosphorus is implanted under the conditions of an accelerating voltage of 600 keV and a dose of $5 \times 10^{12}$ cm$^{-2}$; in the second step, phosphorus is implanted under the conditions of an accelerating voltage of 300 keV and a dose of $5 \times 10^{12}$ cm$^{-2}$; and in the third step, phosphorus is implanted under the conditions of an accelerating voltage of 150 keV and a dose of $5 \times 10^{12}$ cm$^{-2}$.

In order to control the threshold voltage of the P-ch transistor, ion implantation of arsenic is performed under the conditions of an accelerating voltage of 100 keV and a dose of $2 \times 10^{12}$ cm$^{-2}$, and as shown in FIG. 6, an N-type well 10 is formed in a region 9 in which a P-channel transistor is to be formed (hereinafter referred to as the P-ch region 9).

Next, a dummy gate oxide film 11 of a thickness of about 5 nm is formed using a vertical diffusion furnace as shown in FIG. 6. Furthermore, a polysilicon film 12 of a thickness of about 200 nm is formed using LPCVD. At this time, as the material for the dummy gate, amorphous silicon or polysilicon may be substituted by silicon-germanium or the like.

Figure 7:
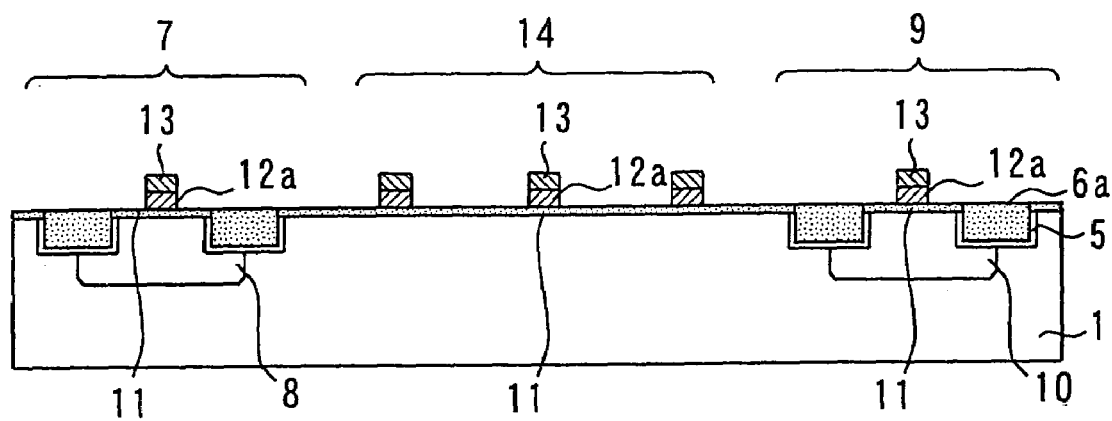

Next, as shown in FIG. 7, a resist pattern 13 is formed using lithography on the gate-forming location of each of the N-ch region 7, the P-ch region 9 and the region 14 in which a gate for a transistor is not formed. Then, dry etching is performed using the resist pattern 13 as the mask to form dummy gates 12a on the N-ch region 7, the P-ch region 9 and the region 14 on which a gate as a transistor is not formed.

At this time, each dummy gate 12a of, for example, a line width of about 0.2 µm and a space width of about 0.5 µm is formed on the gate-forming location of each of the N-ch region 7 and the P-ch region 9. On the other hand, in the region 14 in which a gate for a transistor is not formed, dummy pattern 12a of, for example, a line width of about 1.0 µm and a space width of about 0.5 µm is formed in a line pattern or tile form pattern in substantially the same gate density with transistor forming region, i.e. N-ch region 7 and the P-ch region 9.

Next, a resist pattern (not shown in FIG. 7) is formed on a location other than the N-ch region 7 using lithography.

Figure 8:
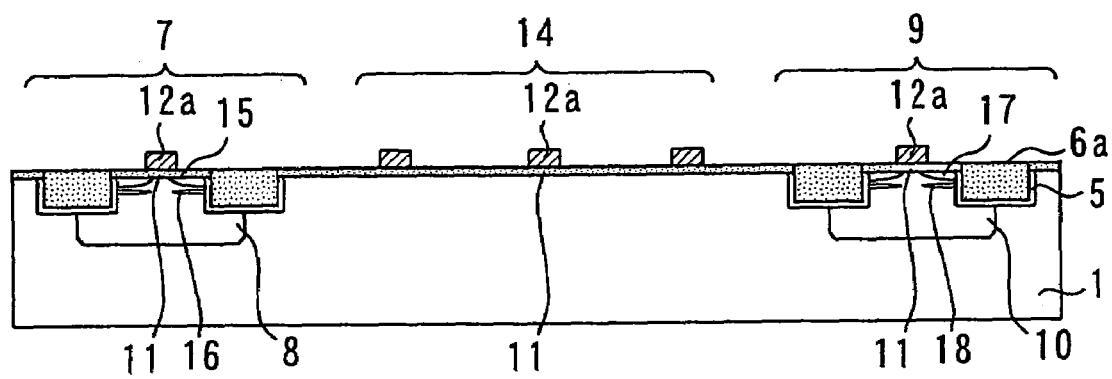

Then, ion implantation of the N-ch extension and the N-ch halo is performed. For the N-ch extension, ion implantation of arsenic is performed under the conditions of an accelerating voltage of 20 keV and a dose of $2 \times 10^{14}$ cm$^{-2}$. For the N-ch halo, ion implantation of boron is performed under the conditions of an accelerating voltage of 25 keV, a dose of $1 \times 10^{13}$ cm$^{-2}$, and an implantation angle of about 30°. Thus, as shown in FIG. 8, the N-ch extension 15 and the N-ch halo 16 are formed in the N-ch region 7.

Next, a resist pattern (not shown) is formed on a location other than the P-ch region 9 using lithography.

Then, ion implantation of the P-ch extension and the P-ch halo is performed. For the P-ch extension, ion implantation of boron difluoride is performed under the conditions of an accelerating voltage of 15 keV and a dose of $3 \times 10^{13}$ cm$^{-2}$. For the P-ch halo, ion implantation of arsenic is performed under the conditions of an accelerating voltage of 150 keV, a dose of $1 \times 10^{13}$ cm$^{-2}$, and an implantation angle of about 30°. Thus, as shown in FIG. 8, the P-ch extension 17 and the P-ch halo 18 are formed in the P-ch region 9.

Figure 9:
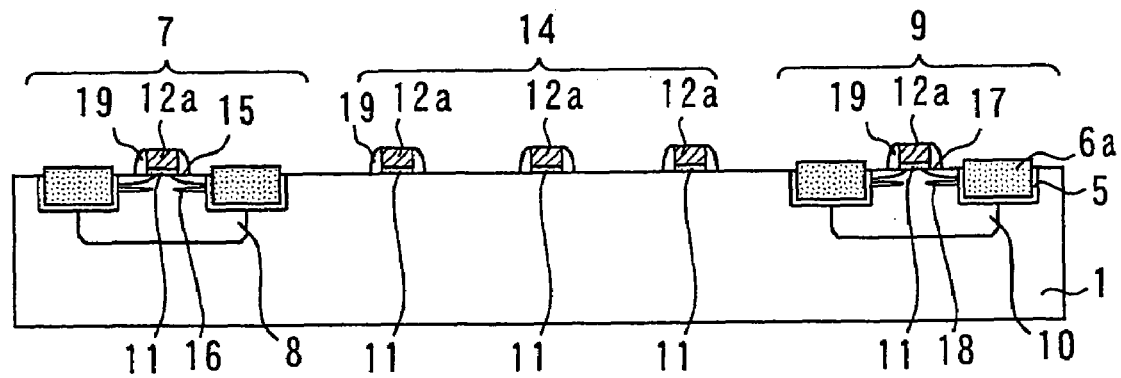

Next, as shown in FIG. 9, a silicon nitride film of a thickness of about 100 nm is formed using LPCVD, and spacers 19 consisting of silicon nitride film are formed by reactive ion etching on the sidewalls of the dummy gates 12a on the N-ch region 7, the P-ch region 9 and the region 14 in which a gate for a transistor is not formed.

Next, a resist pattern (not shown in FIG. 9) is formed on a location other than the N-ch region 7 using lithography. Using this resist pattern as the mask, ion implantation for source/drain formation on the N-ch region 7 is performed.

Figure 10:
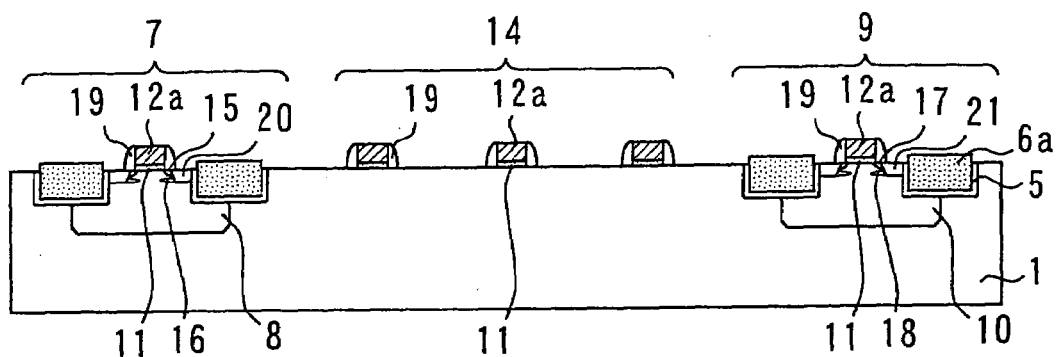

For the ion implantation for N-ch source/drain formation, ion implantation of arsenic is performed under the conditions of an accelerating voltage of 50 keV and a dose of $5 \times 10^{15}$ cm$^{-2}$, and as shown in FIG. 10, the N-ch source/drain 20 is formed in the N-ch region 7.

At this time, since the spacers 19 prevent formation of high-concentration regions in the vicinity of the gate edge, deterioration of MOS performance due to hot electrons in the vicinity of the drain can be prevented.

Next, a resist pattern (not shown) is formed on the location other than the P-ch region 9 using lithography. Using this resist pattern as the mask, ion implantation for source/drain formation on the P-ch region 9 is performed.

For the ion implantation for P-ch source/drain formation, ion implantation of boron is performed under the conditions of an accelerating voltage of 10 keV and a dose of $5 \times 10^{15}$ cm$^{-2}$, and as shown in FIG. 10, the P-ch source/drain 21 is formed in the P-ch region 9.

At this time, since the spacers 19 prevent the formation of high-concentration regions in the vicinity of the gate edge, deterioration of MOS performance due to hot electrons in the vicinity of the drain can be prevented.

Figure 11:
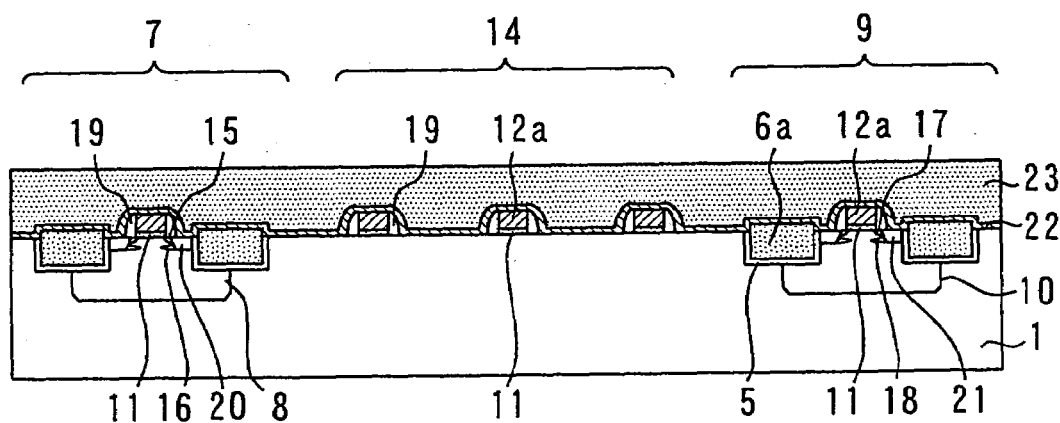

Next, as shown in FIG. 11, a contact-etch stopper film 22 of a thickness of about 30 nm composed of a silicon nitride film is formed using LPCVD so as to coat the entire surfaces of the N-ch region 7, the P-ch region 9 and the region 14 in which a gate for a transistor is not formed. Furthermore, an interlayer insulating film 23 composed of a silicon oxide film of a thickness of about 300 to 500 nm is formed on the contact-etch stopper film 22 using normal-pressure CVD or high density plasma CVD.

Figure 12:
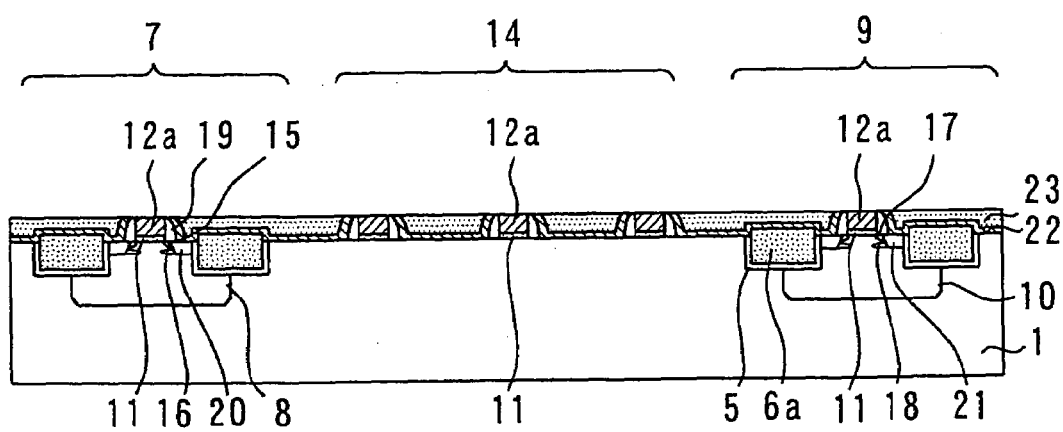

Next, as shown in FIG. 12, the interlayer insulating film 23 and the contact-etch stopper film 22 are polished using CMP to expose the upper surfaces of the dummy gates 12a of the N-ch region 7, the P-ch region 9 and the region 14 in which a gate for a transistor is not formed.

At this time, since the height of the dummy gates 12a of the N-ch region 7 and the P-ch region 9 becomes substantially the same as the height of the dummy gate 12a of the region 14 in which the gate for a transistor is not formed, and since the pattern density of the dummy gates 12a is substantially constant on any place on the P-type silicon substrate 1, a flatness can be achieved without dishing by CMP.

For reference, according to an experiment, dishing of about 3 nm is caused 10 µm apart from a gate edge. In this embodiment, as explained with reference to FIG. 7, dummy gates 12a are formed with approximately 1.0 µm line width and 0.5 µm space width so that dishing is well prevented.

Figure 13:
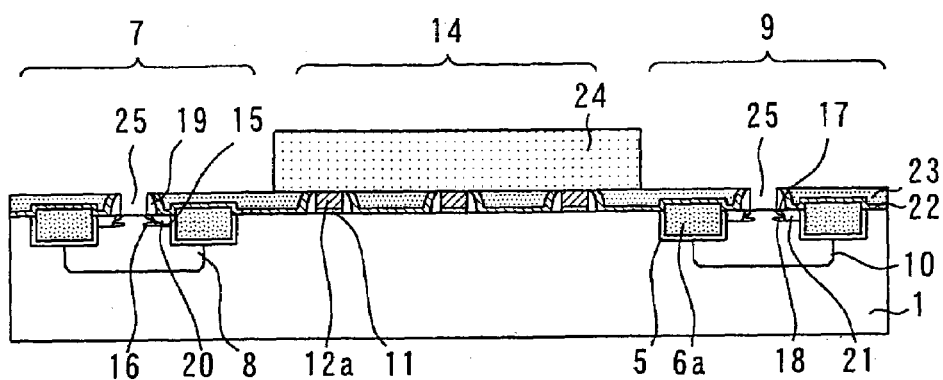

Next, as shown in FIG. 13, a resist pattern 24 is formed using lithography so as to coat the entire surface of the region 14 in which a gate for a transistor is not formed. Using the resist pattern 24 as the mask, the dummy gates 12a and the dummy gate oxide film 11 of the N-ch region 7 and the P-ch region 9 (refer to FIG. 12) are selectively removed using reactive ion etching to form gate trenches 25.

Figure 14:
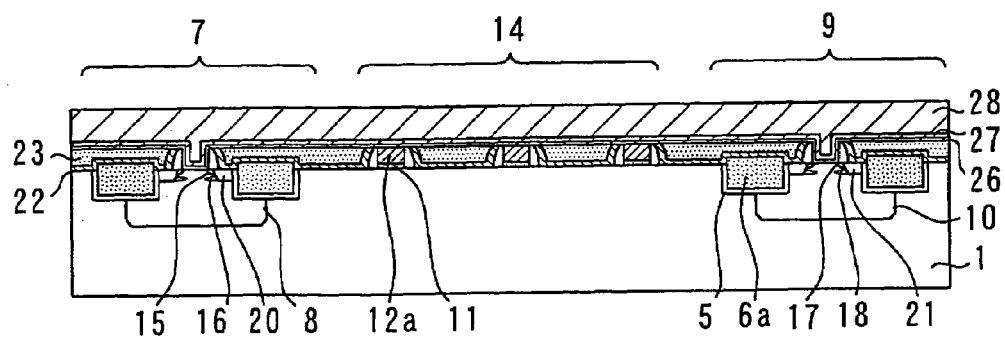

Next, as shown in FIG. 14, a gate insulating film 26 of a thickness of 5 nm composed of a high-k film, a silicon nitride film or the like is formed so as to coat the inside of the gate trenches 25 (refer to FIG. 13). Then a first metal film 27 of a thickness of 5 nm composed of TiN is formed on the inner surface of the trench-shaped gate insulating film 26. At this time, the first metal film 27 also forms a trench. Furthermore, in order to lower the electrical resistance, a second metal film 28 of a thickness of 300 nm composed of tungsten is formed so as to bury the trench of the first metal film 27.

Figure 15:
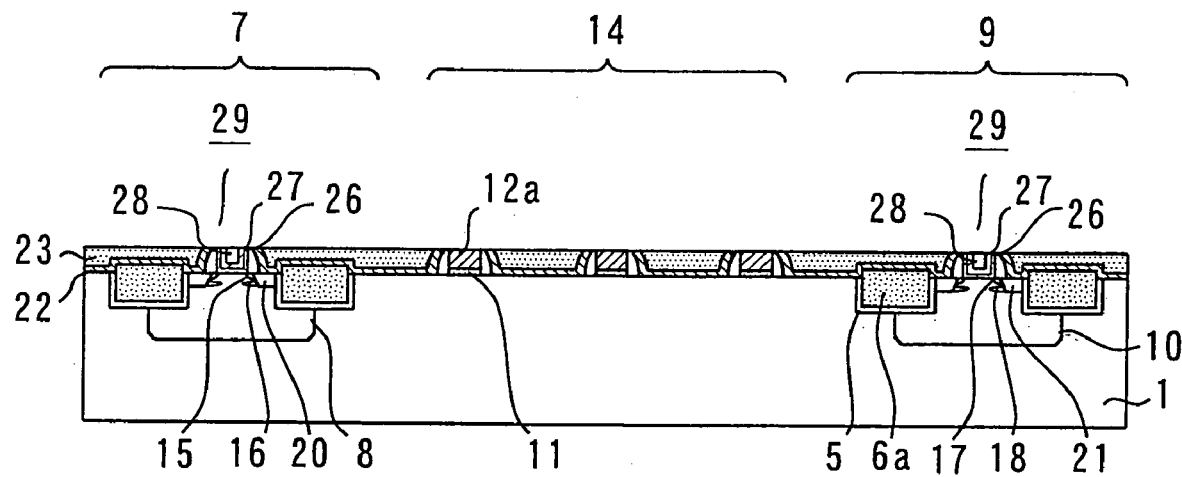

Next, as shown in FIG. 15, the second metal film 28, the first metal film 27 and the gate insulating film 26 formed outside the gate trenches 25 (refer to FIG. 13) of the N-ch region 7 and the P-ch region 9 are removed using CMP to form a Damascene-type gate 29.

In the process shown in FIG. 13, a resist pattern 24 is formed on the region 14 in which a gate for a transistor is not formed. However, the dummy gates 12*a* of the region 14 may be formed to be a Damascene type without forming the resist pattern 24.

Figure 16:
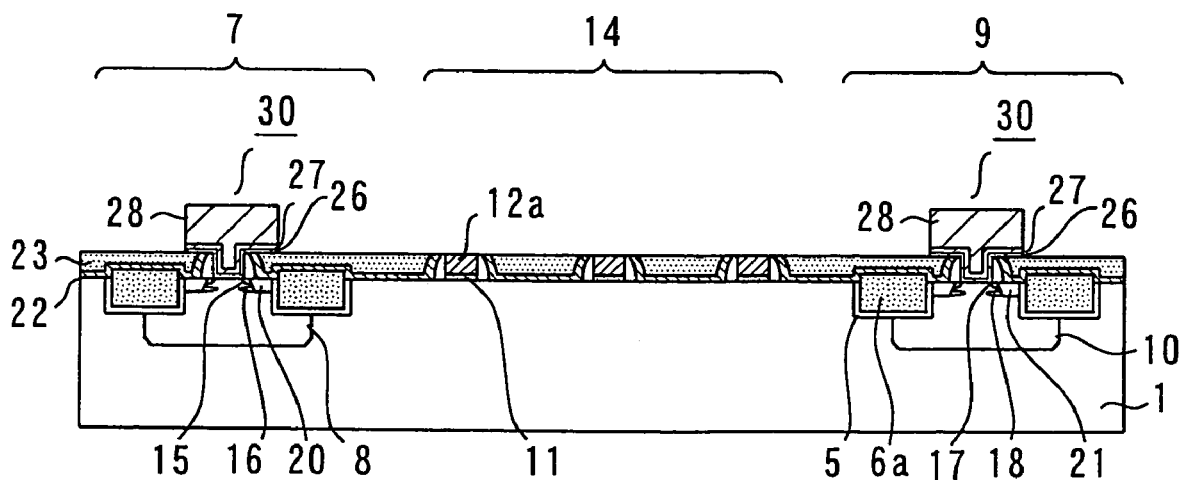

Further, in place of the step shown in FIG. 15, after forming the gate insulating films 26, the first metal film 27, and the second metal film 28, a resist pattern (not shown) of a width larger than the gate width may be formed using lithography on the gate-forming locations of the N-ch region 7 and the P-ch region 9, and the second metal film 28, the first metal film 27 and the gate insulating film 26 may be selectively etched using dry etching to form replacing-type gates 30 as shown in FIG. 16.

Thereafter, whether a Damascene-type gate device is formed or a replacing-type gate device is formed, a second interlayer insulating film is deposited thereon, and contacts and wirings are formed. Since these steps are well known in this technical field, the description thereof will be omitted.

As described above, in the method for manufacturing a semiconductor device having a Damascene-type gate structure or replacing-type gate structure according to this embodiment, dummy gates are formed not only for forming Damascene-type gates or replacing-type gates, but also additional dummy gates are formed on the region in which a gate for a transistor is not formed. Thereby, the density difference of the pattern distribution of a plurality of dummy gates becomes minimized on any place on the substrate so that dishing produced in the CMP process for exposing the upper surfaces of the dummy gates is controlled. Resultantly, a semiconductor device having good wirings without short-circuiting and change in interlayer capacitance can be obtained. Also obtained is a method for manufacturing such a semiconductor device having good wirings in Damascene-type or replacing type gate forming process.

In other words, in combination with a dummy pattern for forming Damascene-type gate electrodes or replacing-type gate electrodes and the additional dummy pattern, the area occupied by the dummy patterns in each portion on a substrate is made equal or substantially equal on any place of the substrate. Therefore, the pattern dependence of CMP is eliminated or improved.

As understood from the above description, the term Damascene-type gate electrode used herein means an electrode having a structure as follows. First, a dummy-gate oxide film and a dummy gate is formed in a trench on a gate-forming location, and an interlayer insulating film of substantially the same height as the dummy gate is formed on the location other than the gate-forming location. Then, the dummy gate and the dummy-gate oxide film are removed from the trench. Then, a new gate insulating film is formed on the bottom and the sidewall of the trench, and a new electrode film is buried in the trench formed by the gate insulating film.

The term replacing-type gate electrode used herein means an electrode having a structure formed as follows. First, a dummy-gate oxide film and a dummy gate is formed in a trench on a gate-forming location, and an interlayer insulating film of substantially the same height as the dummy gate is formed on the location other than the gate-forming location. Then, the dummy gate and the dummy-gate oxide film are removed from the trench. Then, a new gate insulating film is formed on the bottom and the sidewall of the trench and on the nearby interlayer insulating film, and a new electrode film is buried in the trench formed by the gate insulating film and on the nearby interlayer insulating film. Thereby, the new gate insulating film and the electrode film are formed in the trench and extend on the interlayer insulating film for a predetermined length in the lateral direction.

Next, the semiconductor device manufactured in accordance with this embodiment has a structure shown in FIGS. 15 or 16. In other words, the semiconductor device manufactured in accordance with this embodiment has a Damascene-type gate electrode or a replacing-type gate electrodes formed of a metal material, and having dummy pattern electrodes on the locations where the above-described Damascene-type gate electrodes or replacing-type gate electrodes are not formed.

Figure 56:
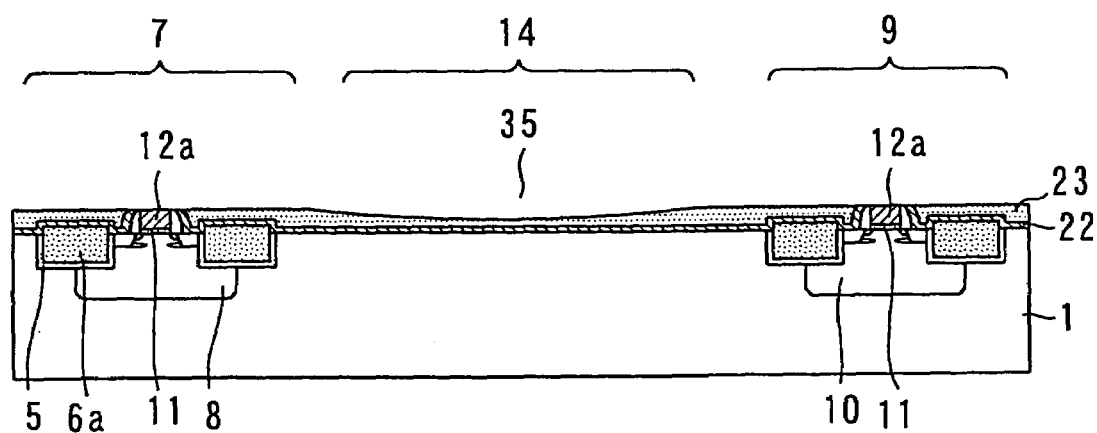
Figure 57:
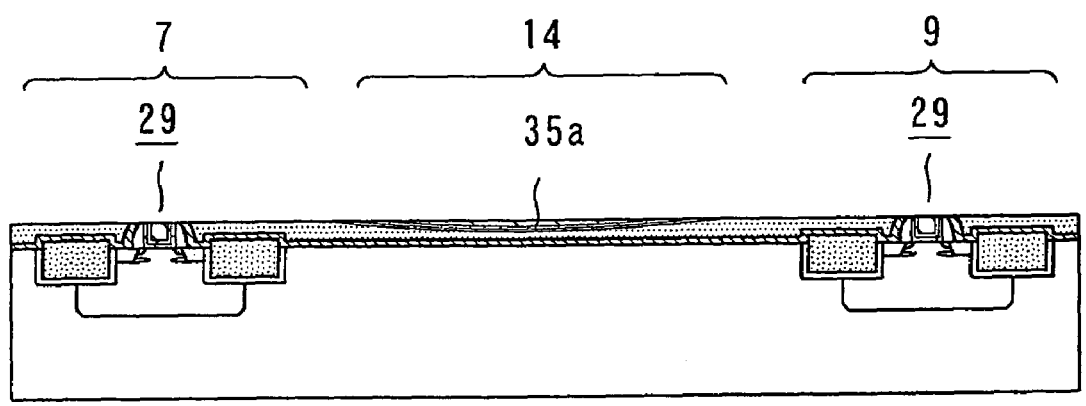

In other words, the density difference of the electrode distribution as a total of combining the Damascene-type gate electrodes or replacing-type gate electrodes with the additional dummy-pattern electrodes is minimized so that a dishing of the insulating film as shown in FIG. 56 is not produced in the region where the distribution of Damascene-type gate electrodes or replacing-type gate electrodes is coarse.

Second Embodiment

FIGS. 17 to 24 are process diagrams for sequentially illustrating a method for manufacturing a semiconductor device according to a second embodiment of the present invention, and show sectional views of a semiconductor device.

First, up to formation of element isolation on a substrate is carried out in a same way as the manufacturing method shown in FIGS. 1–5 in the first embodiment.

Figure 17:
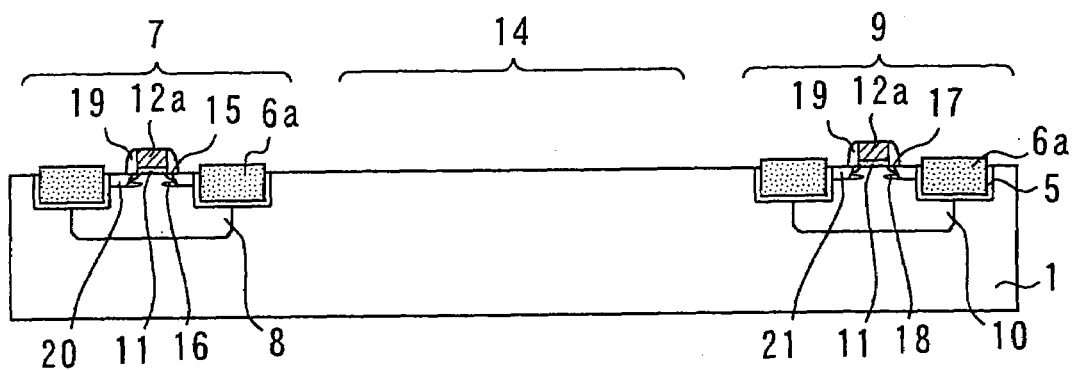
FIGS. 17 to 24 are process diagrams illustrating sequential steps of a method for manufacturing a semiconductor device according to a second embodiment of the present invention, and show sectional views of a semiconductor device.

Thereafter, as shown in FIG. 17, an element isolation 6*a* is formed on the P-type silicon substrate 1, and by lithography and ion implantation, a P-type well 8 and an N-type well 10 are formed on the N-ch region 7 and the P-ch region 9 respectively. Next, a liner oxide film 5, a dummy gate oxide film 11 and a dummy gate 12*a* are formed on both the N-ch region 7 and the P-ch region 9.

Next, by lithography and ion implantation, an N-ch extension 15 and an N-ch halo 16 are formed in the N-ch region 7, and a P-ch extension 17 and a P-ch halo 18 are formed in the P-ch region 9.

Next, a silicon nitride film of a thickness of 100 nm is formed using LPCVD, and spacers 19 are formed by reactive ion etching on the sidewalls of the dummy gates 12*a* on the N-ch region 7 and the P-ch region 9.

Next, by lithography and ion implantation, an N-ch source/drain 20 is formed on the N-ch region 7, and a P-ch source/drain 21 is formed on the P-ch region 9.

At this time, dummy patterns 22*a* are not formed on the region 14 in which a gate for a transistor is not formed.

Figure 18:
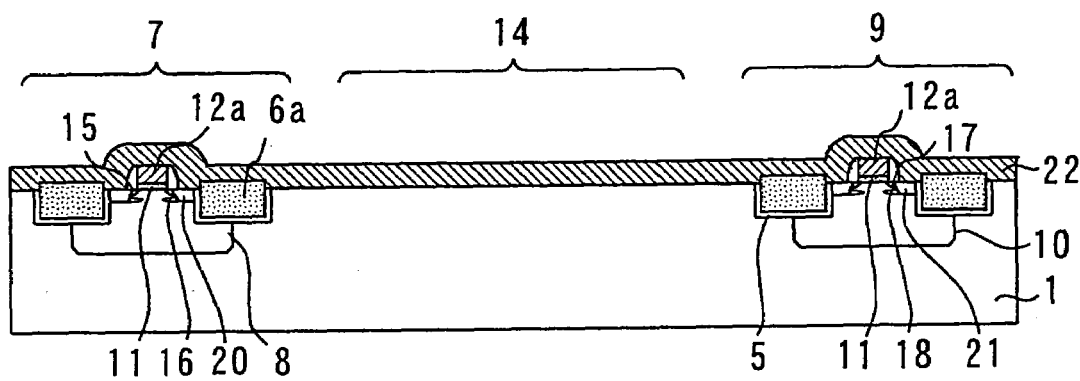

Next, as shown in FIG. 18, a silicon nitride film 22 of a thickness of about 200 nm is formed using LPCVD. At this time, the thickness of the silicon nitride film 22 is set to be slightly thinner than 205 nm, which is the total of the thickness 5 μm of the dummy gate oxide film 11 and the thickness 200 nm of the dummy gate 12a.

Figure 19:
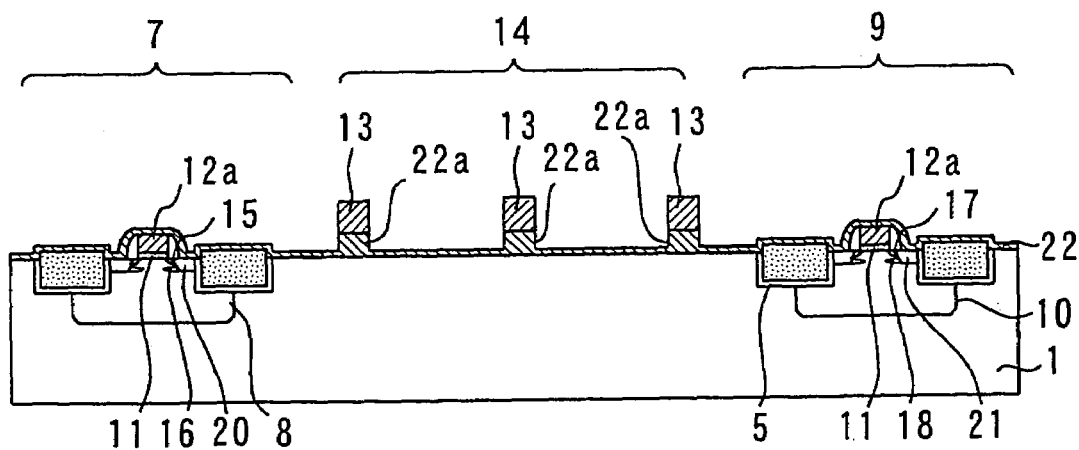

Next, as shown in FIG. 19, a resist pattern 13 of a line width of about 1.0 μm and a space width of about 0.5 μm is formed in line pattern or tile form pattern using lithography on the region 14 in which the gate for a transistor is not formed. Next, the silicon nitride film 22 is selectively etched using the resist pattern 13 as a mask, and a dummy pattern 22a composed of a silicon nitride film is formed on the region 14 in which the gate for a transistor is not formed. At this time, the dummy pattern 22a is arranged at approximately the same density as the dummy gates 12a on the N-ch region 7 and the P-ch region 9.

At this time, in the selective etching of the silicon nitride film 22, a specified thickness is etched so as to leave a certain thickness of the stopper film of the CMP on also the N-ch region 7 and the P-ch region 9. To be more precise, the etching of the stopper film 22 is carried out so as to leave a specified thickness, which is about the same as the thickness of 30 μm of the stopper film 22 of the CMP used in the first embodiment.

By carrying out this etching, a dummy pattern 22a composed of a silicon nitride film is formed on the region 14 in which a gate for a transistor is not formed. The height of the dummy pattern 22a is close to and just slightly lower than the height of the dummy gates 12a. Also, on a location other than the location where the dummy pattern 22a is formed, the silicon nitride film 22 is left with a thickness of about 30 nm. This thickness is equivalent to the contact-etch stopper film 22 in the first embodiment, thus the silicon nitride film 22 in this embodiment functions as the stopper film of the CMP.

Figure 20:
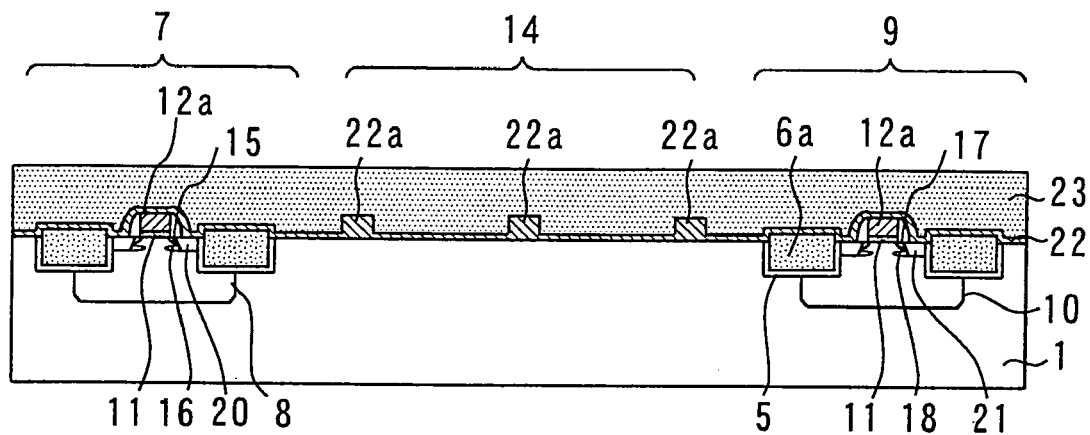

Next, as shown in FIG. 20, an interlayer insulating film 23 composed of a silicon oxide film of a thickness of about 300 to 500 nm is formed using normal-pressure CVD or high density plasma CVD on the entire surface including the N-ch region 7, the P-ch region 9 and the region 14 in which a gate for a transistor is not formed.

Figure 21:
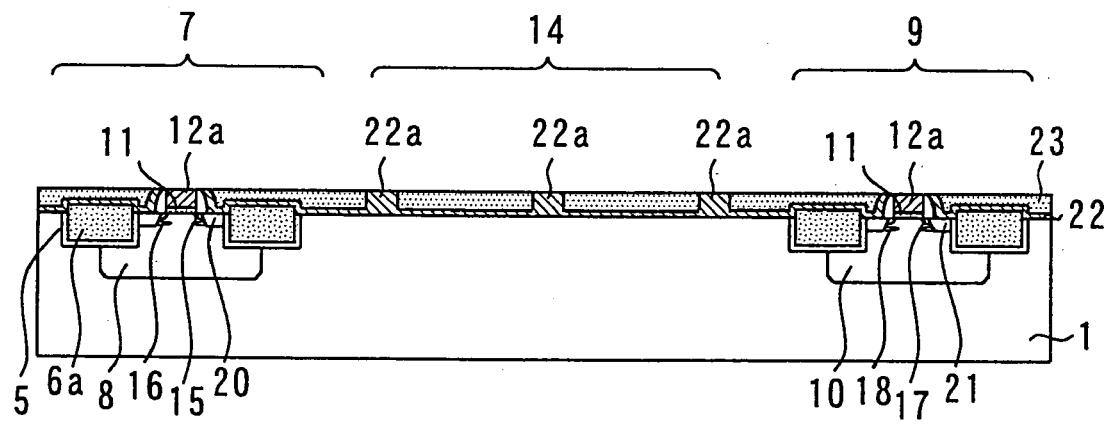

Next, as shown in FIG. 21, the interlayer insulating film 23 and the stopper film 22 of the CMP are polished using CMP to expose the upper surface of the dummy gates 12a of the N-ch region 7 and the P-ch region 9.

At this time, the height of the dummy patterns 22a of the region 14, in which dummy gate for a transistor is not formed, is almost the same as or just slightly lower than the dummy gates 12a on the N-ch region 7 and the P-ch region 9. Further, the density of the patterns as a whole in combination with the dummy patterns 22a of the region 14, in which the gate for a transistor is not formed, and the dummy gates 12a of the N-ch region 7 and the P-ch region 9 is substantially even on any place of the P-type silicon substrate. Accordingly, a flatness can be achieved without dishing by CMP. Here, the upper surface of the dummy pattern 22a does not necessarily have to be exposed.

Figure 22:
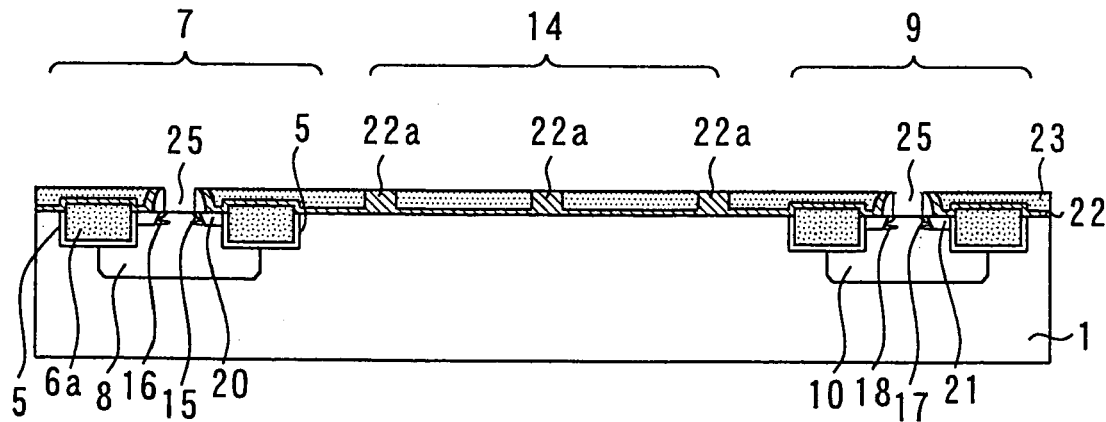

Next, as shown in FIG. 22, the dummy gates 12a and the dummy gate oxide film 11 of the N-ch region 7 and the P-ch region 9 are selectively removed using reactive ion etching to form gate trenches 25.

Figure 23:
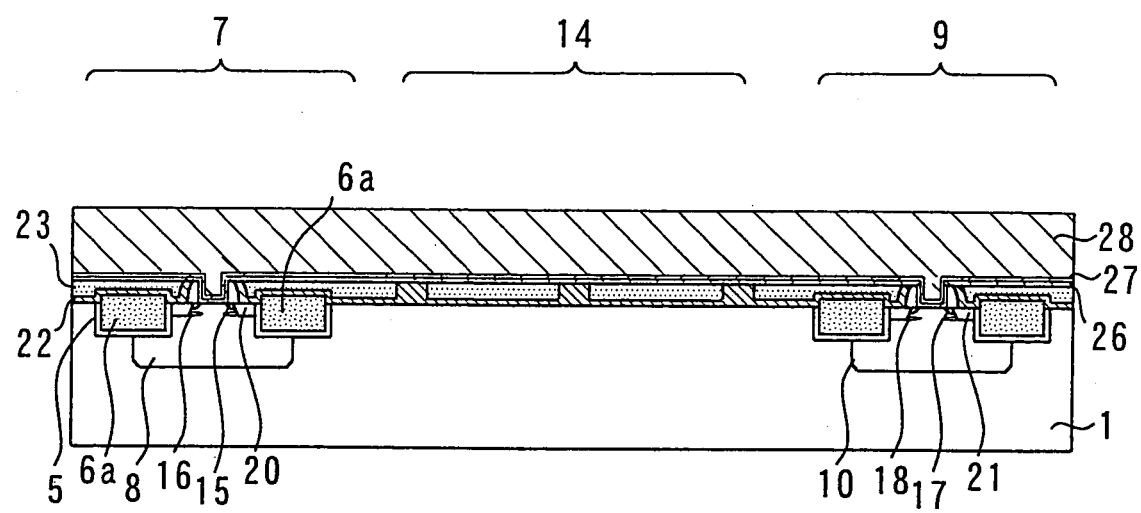

Next, as shown in FIG. 23, a gate insulating film 26 of a thickness of 5 nm composed of a high-k film, a silicon nitride film or the like is formed so as to coat the inside of the gate trenches 25 (refer to FIG. 22). Then, a first metal film 27 of a thickness of 5 nm composed of TiN is formed on the inner surface of the trench-shaped gate insulating film 26. At this time, the first metal film 27 also leaves a trench. Furthermore, in order to lower the electrical resistance, a second metal film 28 of a thickness of 300 nm composed of tungsten is formed so as to bury the trench of the first metal film 27.

Figure 24:
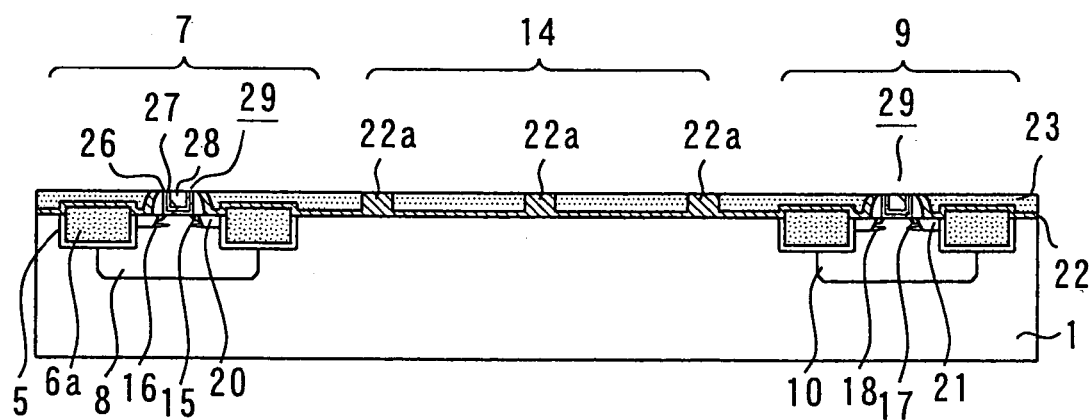

Next, as shown in FIG. 24, a second metal film 28, the first metal film 27 and the gate insulating film 26 formed outside the gate trenches 25 (refer to FIG. 22) of the N-ch region 7 and the P-ch region 9 are removed using CMP to form a Damascene-type gate 29.

Here, an example of a Damascene-type gate is shown. However, a replacing-type gate may be formed by the method as explained in the first embodiment.

As described above, in the semiconductor device and the method for manufacturing the semiconductor device having a Damascene-type or replacing-type structure according to this embodiment, additional dummy patterns are formed with the same material as the stopper film of the CMP on the region in which the gate for a transistor is not formed. Thereby, the dummy pattern is arranged on the region, in which the gate for a transistor is not formed, at the same density as the dummy gates on which the gate for a transistor is formed.

Accordingly, dishing produced in the CMP step for exposing the upper surface of the dummy gates is controlled. Thus, a semiconductor device without short-circuiting of wirings and change in interlayer, capacitance can be obtained. Also obtained is a method for manufacturing such a semiconductor device that enables formation of good wirings in a Damascene-type gate or replacing-type gate forming step.

Third Embodiment

FIGS. 25 to 32 are process diagrams for sequentially illustrating a method for manufacturing a semiconductor device according to a third embodiment of the present invention, and show sectional views of a semiconductor device.

Figure 25:
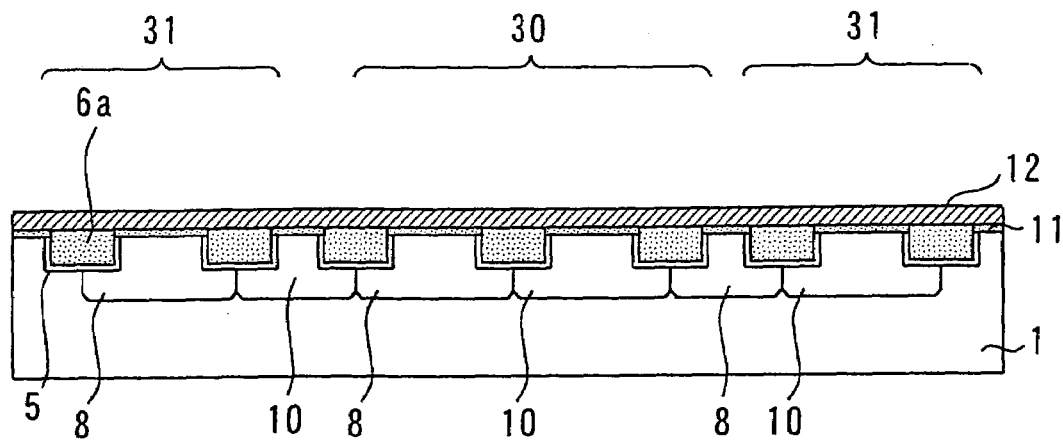
FIGS. 25 to 32 are process diagrams illustrating sequential steps of a method for manufacturing a semiconductor device according to a third embodiment of the present invention, and show sectional views of a semiconductor device.

In the device shown in FIG. 25, the method for manufacturing the semiconductor device until the element isolation 6a is formed is the same as that in the first embodiment.

Thereafter, as shown in FIG. 25, by lithography and ion implantation, a P-type well 8 and an N-type well 10 are formed in a region 30 in which an internal circuit is formed (hereinafter referred to as the internal circuit region 30), and in a region 31 in which an I/O circuit is formed (hereinafter referred to as the I/O circuit region 31) respectively on the major surface of a P-type silicon substrate 1. Ion implantation for forming the wells is carried out under the same conditions as those in the first embodiment.

Next, a gate oxide film 11 of a thickness of about 5 nm is formed using a vertical diffusion furnace. Furthermore, a polysilicon film 12 of a thickness of about 200 nm is formed using LPCVD.

Figure 26:
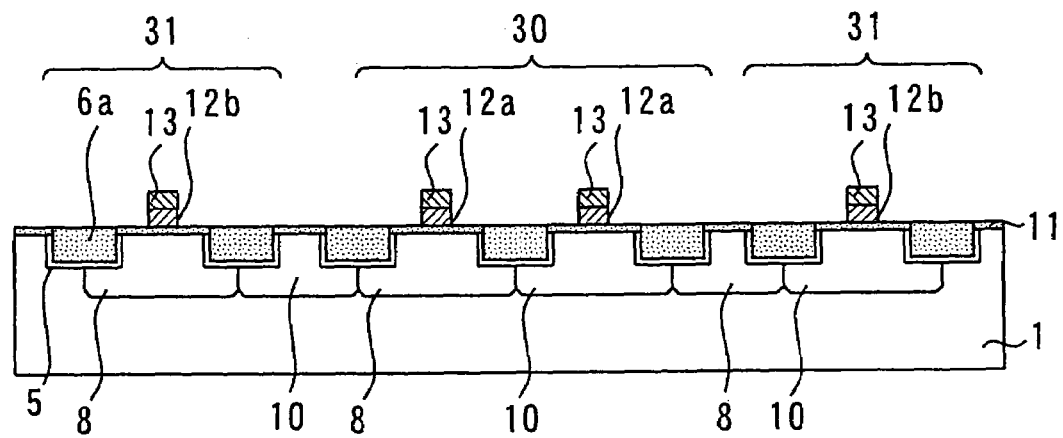

Next, as shown in FIG. 26, a resist pattern 13 is formed using lithography on the internal circuit region 30 and the I/O circuit region 31. Next, dry etching is performed using the resist pattern 13 as a mask, and a dummy gate 12a is formed in the internal circuit region 30, and a gate 12b is formed in the I/O circuit region 31 respectively. At this time, the gate 12b is arranged in the I/O circuit region 31 so that the density difference of dummy gates 12a is eliminated as a whole on the P-type silicon substrate 1.

Figure 27:
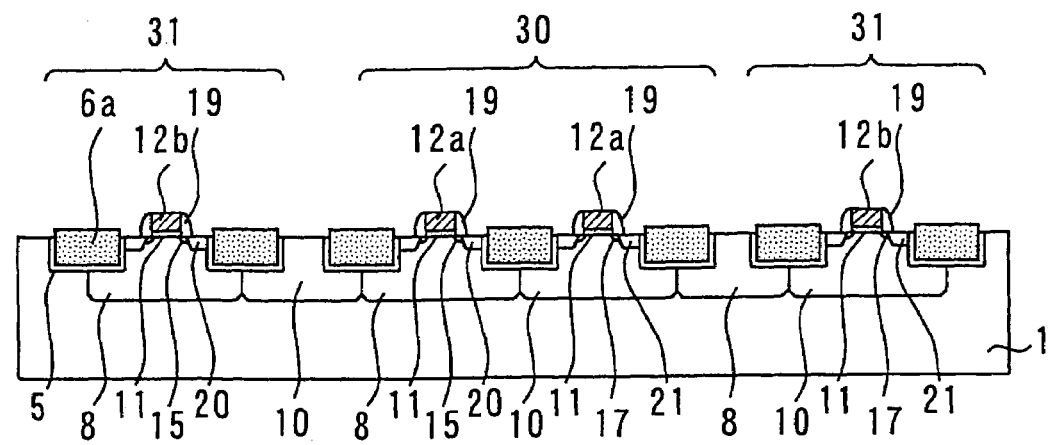

Next, as shown in FIG. 27, by lithography and ion implantation, an N-ch extension 15 and a P-ch extension 17 are formed in the internal circuit region 30, and an N-ch extension 15 and a P-ch extension 17 are formed in the I/O circuit region 31.

Next, a silicon nitride film of a thickness of 100 nm is formed using LPCVD, and spacers 19 consisting of silicon nitride films are formed by reactive ion etching on the sidewalls of the dummy gates 12a in the internal circuit region 30 and on the sidewalls of gates 12b in the I/O circuit region 31.

Next, by lithography and ion implantation, the N-ch source/drain 20 and the P-ch source/drain 21 are formed in the internal circuit region 30, and N-ch source/drain 20 and the P-ch source/drain 21 are formed in the I/O circuit region 31.

At this time, ion implantation for forming the extensions and the source/drains formed in the internal circuit region 30 and in the 1/O circuit region 31 is carried out under the same conditions as those in the first embodiment.

Figure 28:
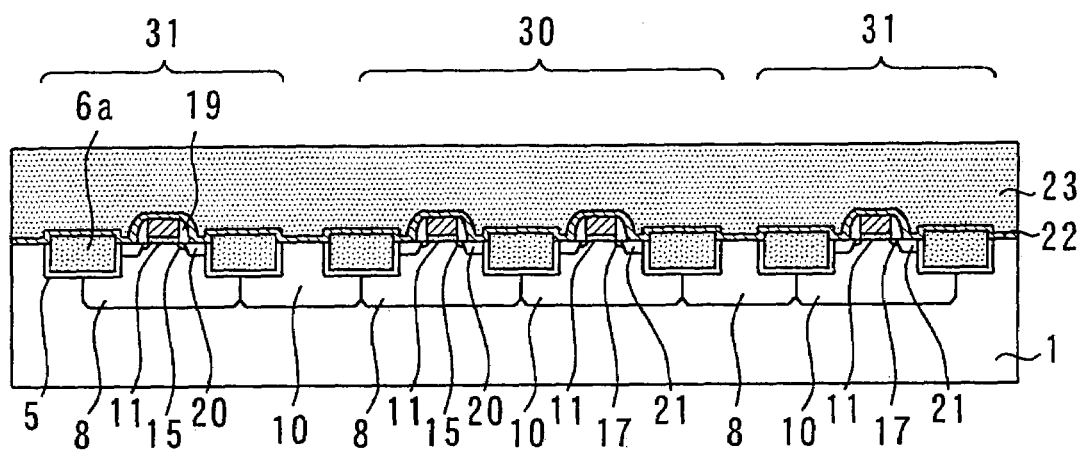

Next, as shown in FIG. 28, a contact-etch stopper film 22 of a thickness of about 30 nm composed of a silicon nitride film is formed using LPCVD. Furthermore, an interlayer insulating film 23 composed of a silicon oxide film of a thickness of about 300 to 500 nm is formed on the contact-etch stopper film 22 using normal-pressure CVD or high density plasma CVD.

Figure 29:
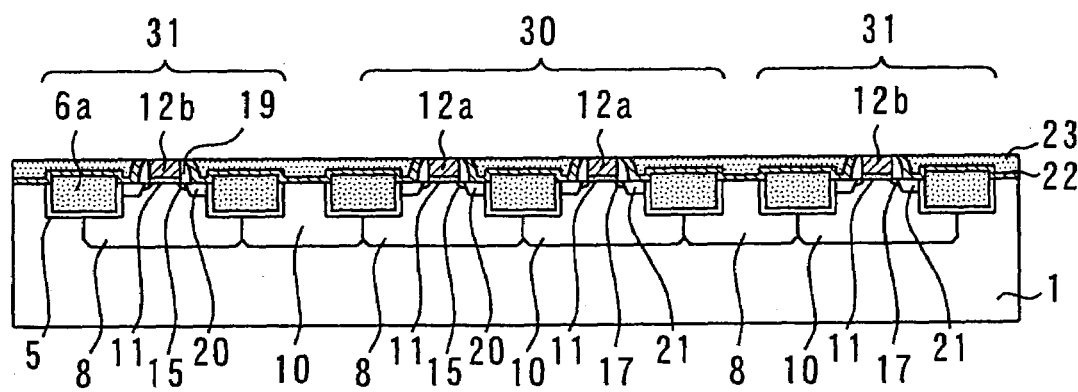

Next, as shown in FIG. 29, the interlayer insulating film 23 and the contact-etch stopper film 22 are polished using CMP to expose the upper surface of the dummy gates 12a of the internal circuit region 30 and the upper surface of the gate 12b of the I/O circuit region 31.

At this time, the height of the dummy gates 12a of the internal circuit region 30 and the gate 12b of the I/O circuit region 31 is substantially the same, and the gate density in combination with the dummy gates 12a of the internal circuit region 30 and the gate 12b of the I/O circuit region 31 is substantially constant on any place on the P-type silicon substrate 1. Thus, flatness can be achieved without dishing by CMP.

Figure 30:
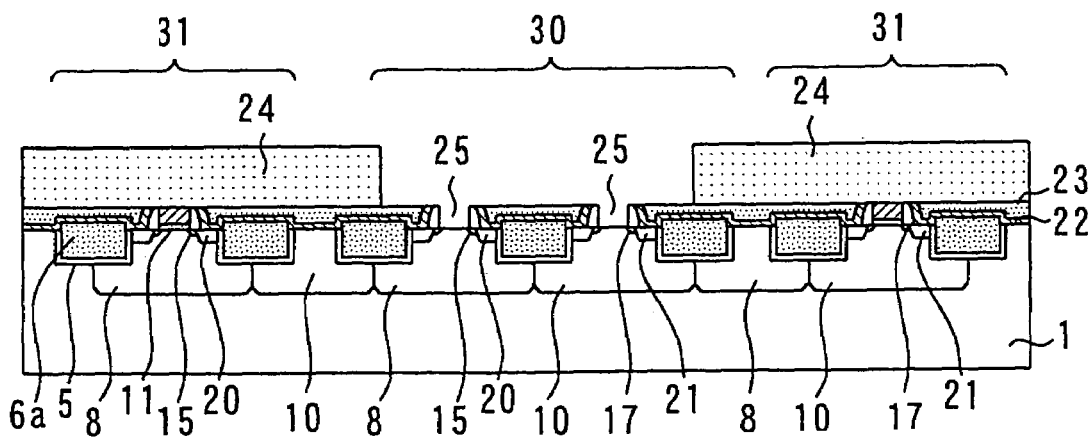

Next, as shown in FIG. 30, a resist pattern 24 is formed using lithography on a location other than the internal circuit region 30. Next, the dummy gates 12a and the gate oxide film 11 (refer to FIG. 29) of the internal circuit region 30 are selectively removed to form gate trenches 25.

Figure 31:
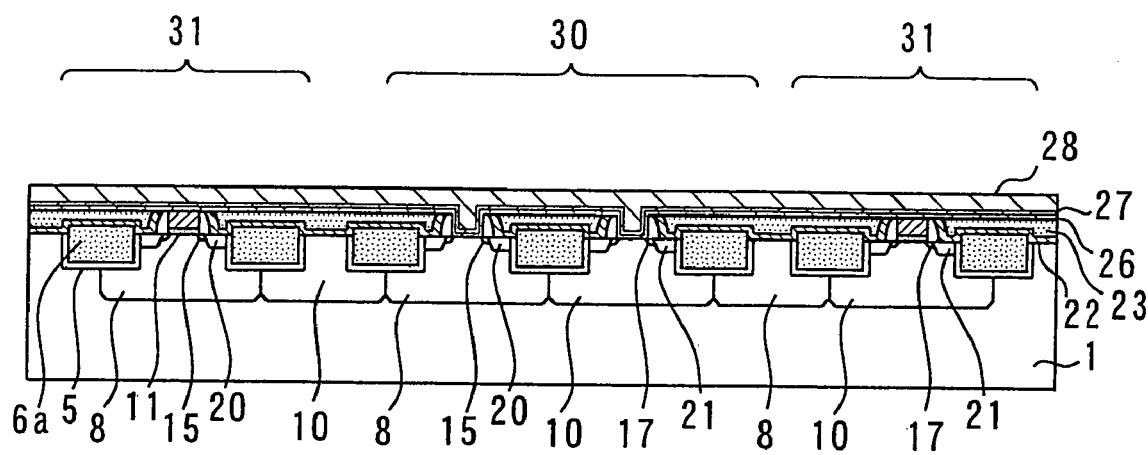

Next, as shown in FIG. 31, a gate insulating film 26 of a thickness of 5 nm, composed of a high-k film, a silicon nitride film or the like, is formed so as to coat the inside of the gate trenches 25 (refer to FIG. 30). Then, a first metal film 27 of a thickness of 5 nm composed of TiN is formed on the inner surface of the trench-shaped gate insulating film 26. At this time, the first metal film 27 also forms a trench. Furthermore, in order to lower the electrical resistance, a second metal film 28 of a thickness of 300 nm composed of tungsten is formed so as to bury the trench of the first metal film 27.

Figure 32:
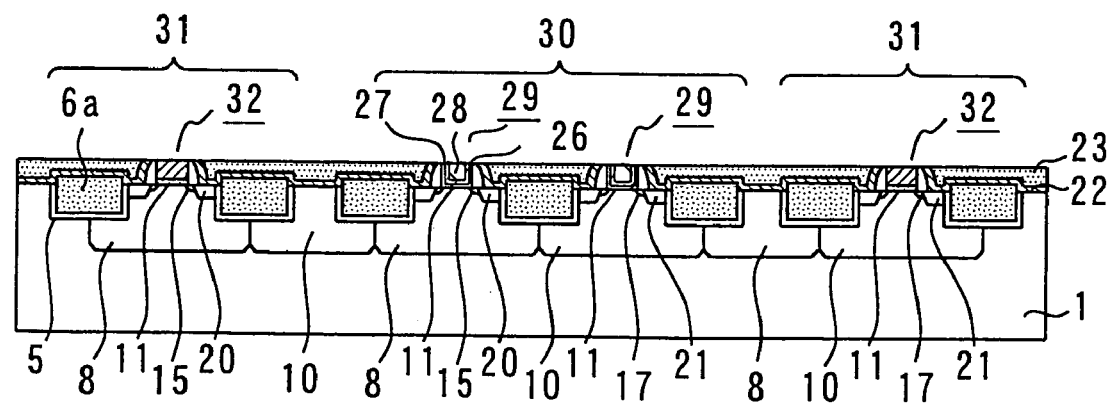

Next, as shown in FIG. 32, a second metal film 28, the first metal film 27, and the gate insulating film 26 formed outside the gate trenches 25(refer to FIG. 30) of the internal circuit region 30 are removed using CMP to form Damascene-type gates 29 in the internal circuit region 30, and to form transistors 32 on the I/O circuit of the I/O circuit region 31.

Here, an example of a Damascene-type gate is shown. However, a replacing-type gate may be formed by the method as shown in the first embodiment.

According to the above-described method of manufacture, it is possible to form a transistor for an I/O circuit, of which the gate insulating film and the threshold value (Vt) are different from an internal circuit, without increasing the number of processes, by utilizing the forming process of the dummy gates during manufacture of a Damascene-type transistor or a replacing-type transistor for the internal circuit.

Thereafter, as in the first embodiment, a second interlayer insulating film is deposited thereon, and contacts and wirings are formed.

As described above, in a semiconductor device having a Damascene-type or replacing-type structure and the method for manufacturing the semiconductor device according to this embodiment, unevenness of pattern density is avoided by arranging dummy gates in the positions where the gates are formed as a transistor which is used as an internal circuit, and gate electrodes used in the I/O circuit in the region not used as an internal circuit.

As described above, in a semiconductor device having a Damascene-type or replacing-type structure and the method for manufacturing the semiconductor device according to this embodiment, dummy gates are arranged at the positions where the gates for transistors are formed for an internal circuit, and gate electrodes for the I/O circuit are arranged in the region not used for an internal circuit in order to avoid unevenness of the pattern density as a whole on the substrate. Thereby, dishing produced in the CMP step for exposing the upper surfaces of the dummy gates is controlled. Thus, a semiconductor device without short-circuiting of wirings and change in interlayer capacitance in the Damascene-type gate can be obtained. Also obtained is a method for manufacturing such a semiconductor device that enables formation of good wirings in the Damascene-type gate forming step. Furthermore, since the dummy patterns of the Damascene-type gate and the gate electrodes used in the I/O circuit can be formed simultaneously, the processes may be simplified.

Fourth Embodiment

FIGS. 33 to 43 are process diagrams for sequentially illustrating a method for manufacturing a semiconductor device according to a fourth embodiment of the present invention, and show sectional views of a semiconductor device.

First, formation of element isolation on a substrate is carried out in a same way as the manufacturing method in the first embodiment.

Figure 33:
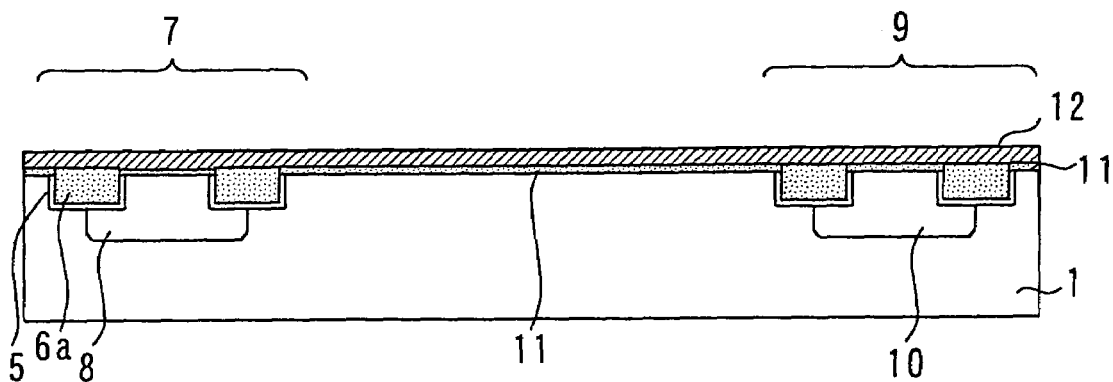
FIGS. 33 to 43 are process diagrams illustrating sequential steps of a method for manufacturing a semiconductor device according to a fourth embodiment of the present invention, and show sectional views of a semiconductor device.

Thereafter, as shown in FIG. 33, after an element isolation 6a is formed on the P-type silicon substrate 1, a P-type well 8 and an N-type well 10 are formed in the N-ch region 7 and the P-ch region 9 respectively. A gate oxide film 11 of a thickness of 5 nm is formed using a vertical diffusion furnace, and a polysilicon film 12 of a thickness of 200 nm is formed using LPCVD.

Figure 34:
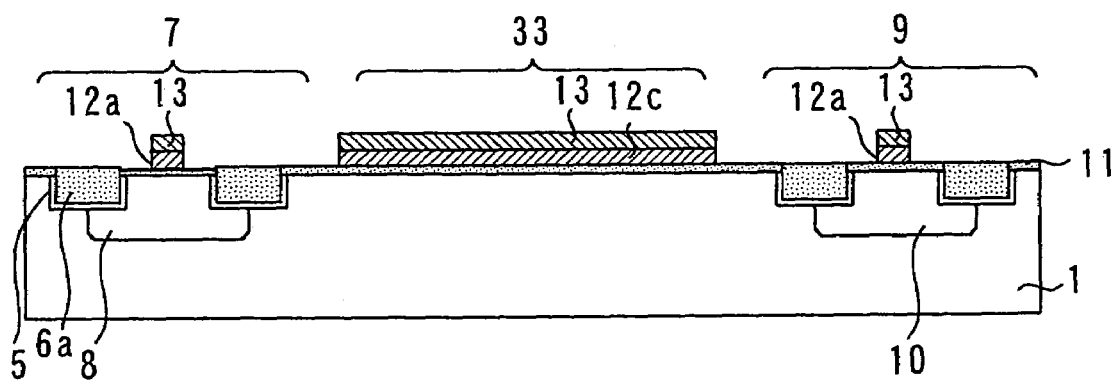

Next, as shown in FIG. 34, a resist pattern 13 is formed on the N-ch region 7, P-ch region and a region 33 on which a capacitor for an analog circuit is formed (hereinafter referred to as the analog circuit capacitor region 33). Next, dry etching is performed using the resist pattern 13 as a mask, and dummy gates 12a are formed on the N-ch region 7 and the P-ch region 9, and a capacitor electrode 12c for the analog circuit capacitor is formed in the analog circuit capacitor region 33.

Figure 35:
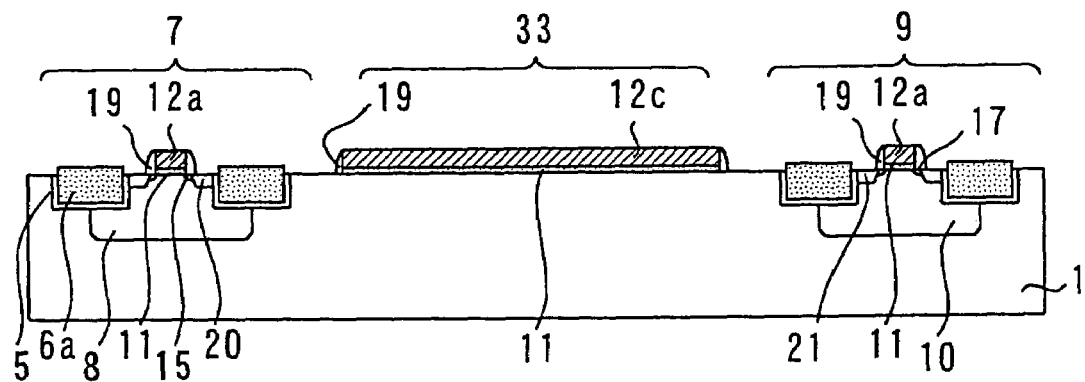

Next, as shown in FIG. 35, by lithography and ion implantation, an N-ch extension 15 is formed in the N-ch region 7, and a P-ch extension 17 is formed in the P-ch region 9. Next, a silicon nitride film of a thickness of about 100 nm is formed using LPCVD, and spacers 19 consisting of a silicon nitride film are formed by reactive ion etching on the sidewalls of the dummy gates 12a on the N-ch region 7 and the P-ch region 9, and the capacitor electrode 12c for the analog capacitor in the circuit capacitor region 33.

Next, by lithography and ion implantation, the N-ch source/drain 20 is formed in the N-ch region 7, and the P-ch source/drain 21 is formed in the P-ch region 9. At this time, ion implantation of the extensions and of the source/drain formed on each of the regions is carried out under the same conditions as those in the first embodiment.

Figure 36:
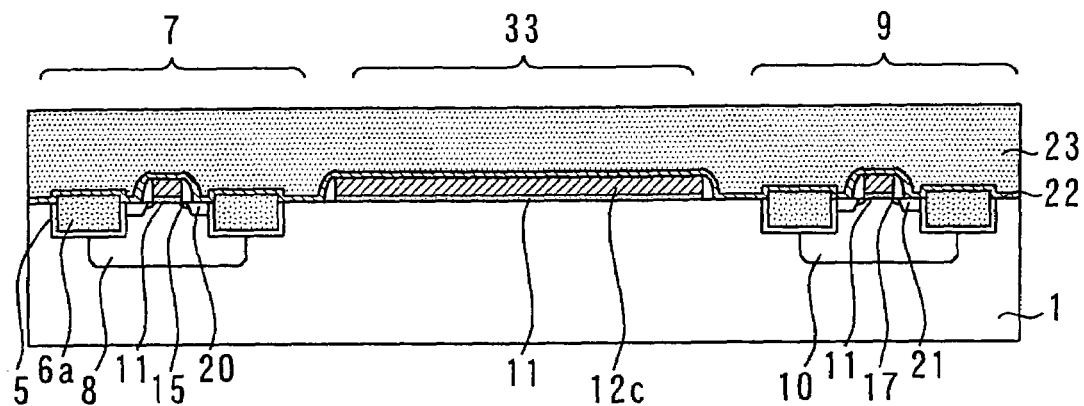

Next, as shown in FIG. 36, a contact-etch stopper film 22 of a thickness of about 30 nm composed of a silicon nitride film is formed using LPCVD so as to coat the N-ch region 7, the P-ch region 9 and the analog circuit capacitor region 33, i.e. the entire surface. Furthermore, an interlayer insulating film 23 composed of a silicon oxide film of a thickness of about 300 to 500 nm is formed on the contact-etch stopper film 22 using normal-pressure CVD or high density plasma CVD.

Figure 37:
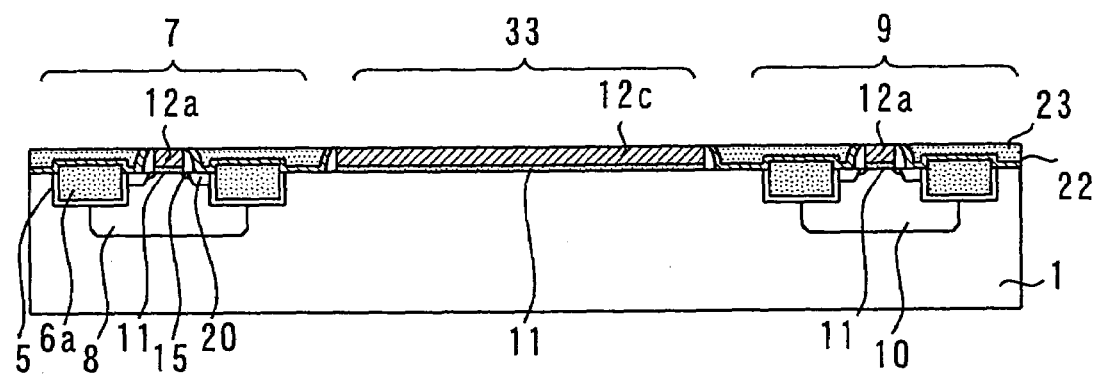

Next, as shown in FIG. 37, the interlayer insulating film 23 and the contact-etch stopper film 22 (refer to FIG. 36) are polished using CMP to expose the upper surfaces of the dummy gates 12a of the N-ch region 7 and the P-ch region 9 and the upper surface of the capacitor electrode 12c in the analog circuit capacitor region 33.

At this time, the height of the dummy gates 12a of the N-ch region 7 and the P-ch region 9 becomes substantially the same as the height of the capacitor electrode 12c of the analog circuit capacitor region 33. Further, since the capacitor gate electrode 12c is arranged on the analog circuit capacitor region 33, the density difference of the pattern distribution of the dummy gates becomes minimized on the P-type silicon substrate 1 compared to the state in which there is no capacitor electrode 12c. Thus, flatness can be achieved without dishing by CMP.

Figure 38:
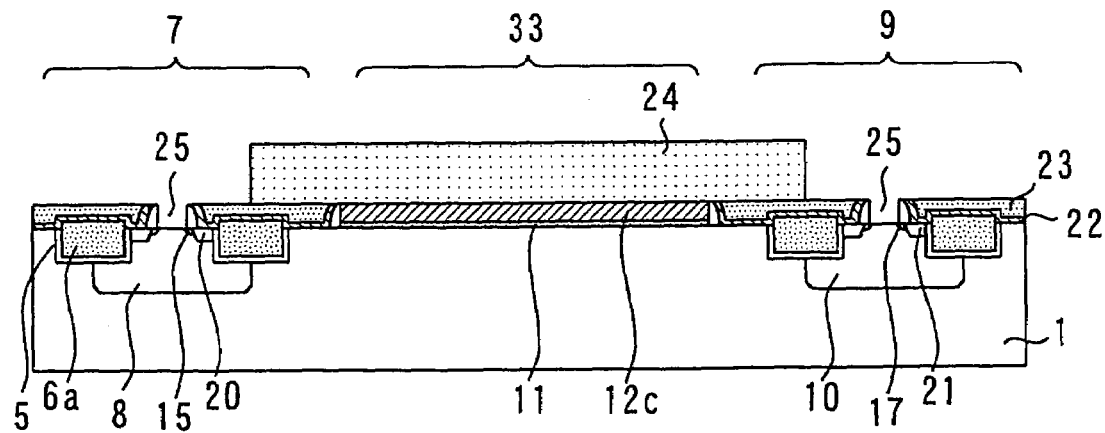

Next, as shown in FIG. 38, a resist pattern 24 is formed using lithography so as to coat the upper surface of the analog circuit capacitor region 33, and the dummy gates 12a and the dummy gate oxide film 11 of the N-ch region 7 and the P-ch region 9 (refer to FIG. 37) are selectively etched using dry etching to form gate trenches 25.

Figure 39:
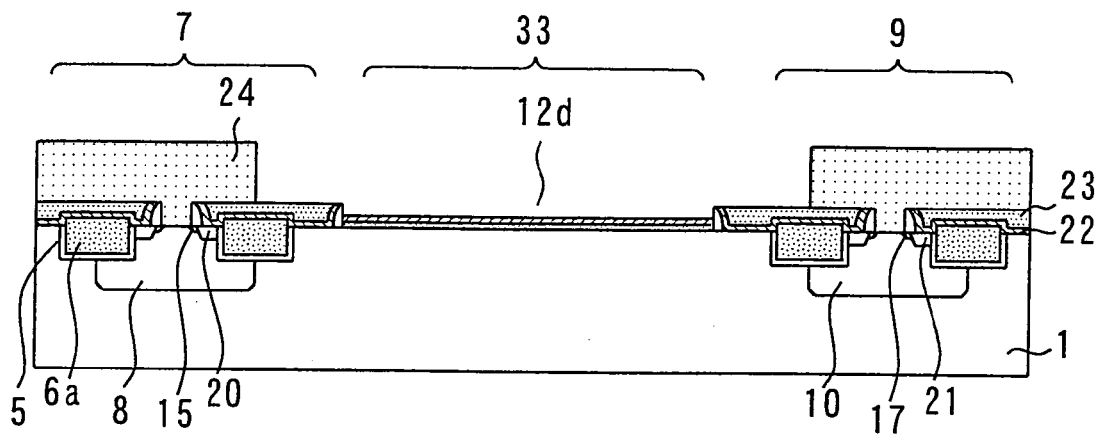

Next, as shown in FIG. 39, a resist pattern 24 is formed using lithography on the N-ch region 7 and the P-ch region 9, and half of the thickness, i.e. about 100 nm, of the capacitor electrode 12c for the analog circuit is selectively etched, and a trench 12d for the analog circuit capacitor electrode is formed.

In the case where a replacing-type gate electrode is to be formed on the N-ch region 7 and the P-ch region 9 as described in the first to the third embodiments, the process to form a trench for the analog circuit capacitor electrode on the analog circuit capacitor region 33 (the process of FIG. 39) may be omitted.

Furthermore, in this embodiment, the process to form a gate trench as shown in FIG. 38 is carried out first, and then the process to form the trench for the capacitor electrode for the analog circuit on the analog circuit capacitor region 33 as shown in FIG. 39 follows. However, the order of the processes for formation of the trenches may be reversed.

Figure 40:
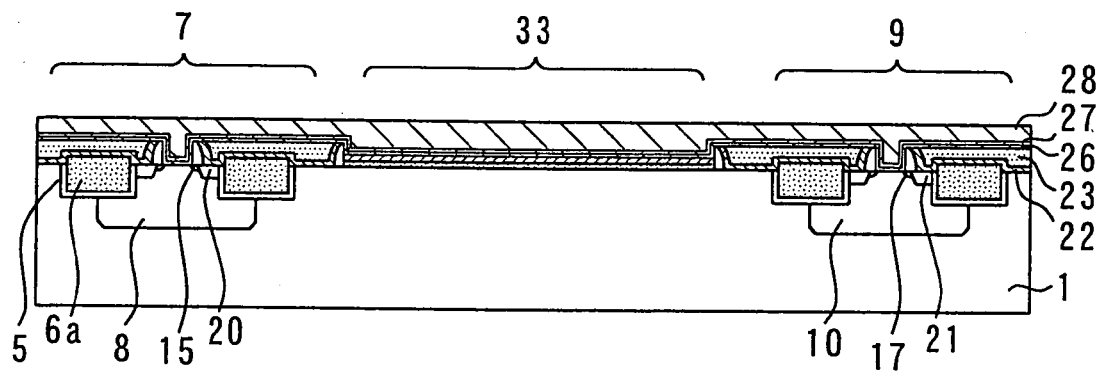

Next, as shown in FIG. 40, a gate insulating film 26 of a thickness of 5 nm composed of a high-k film, a silicon nitride film or the like is formed so as to coat the inside of the gate trenches 25 (refer to FIG. 38) and the inside of the trench 12d (refer to FIG. 39) for the analog circuit capacitor electrode. Then, a first metal film 27 of a thickness of 5 nm composed of TiN is formed on the inner surface of the trench-shaped gate insulating film 26. At this time, the first metal film 27 also forms trenches. Furthermore, in order to lower the electrical resistance, a second metal film 28 of a thickness of 300 nm composed of tungsten is formed so as to bury the trenches of the first metal film 27.

Figure 41:
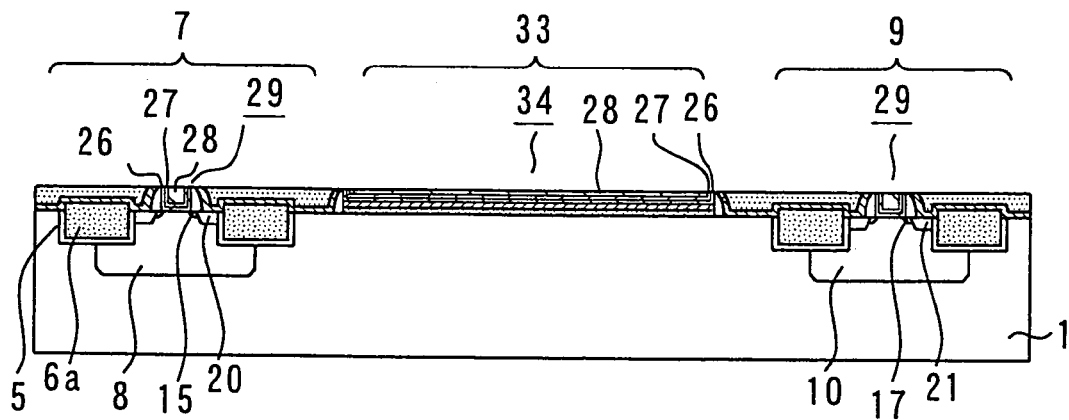

Next, as shown in FIG. 41, a second metal film 28, the first metal film 27 and the gate insulating film 26 which are formed outside the gate trenches 25 (refer to FIG. 38) of the N-ch region 7 and the P-ch region 9 are removed using CMP to form a Damascene-type gate 29 on the N-ch region and the P-ch region, and an analog circuit capacitor 34 is formed on the analog circuit capacitor region 33.

Here, an example of a Damascene-type gate is shown. However, formation of the gates on the N-ch region 7 and the P-ch region 9 may also be carried out by the method of the replacing-type gate, as in the first embodiment. At this time, the process to form a trench for the analog circuit capacitor electrode on the analog circuit capacitor region 33 may be omitted. In this case, the structure becomes like that shown in FIG. 42 including replacing-type gates 30 and an analog circuit capacitor 34a.

According to the above-described method of manufacture, it is possible to form an analog circuit capacitor without increasing the number of processes, by utilizing the forming process of a dummy gate transistor during manufacture of a Damascene-type transistor or a replacing-type transistor.

Thereafter, a second interlayer insulating film is deposited thereon and contacts and wirings are formed as in the first embodiment.

Figure 42:
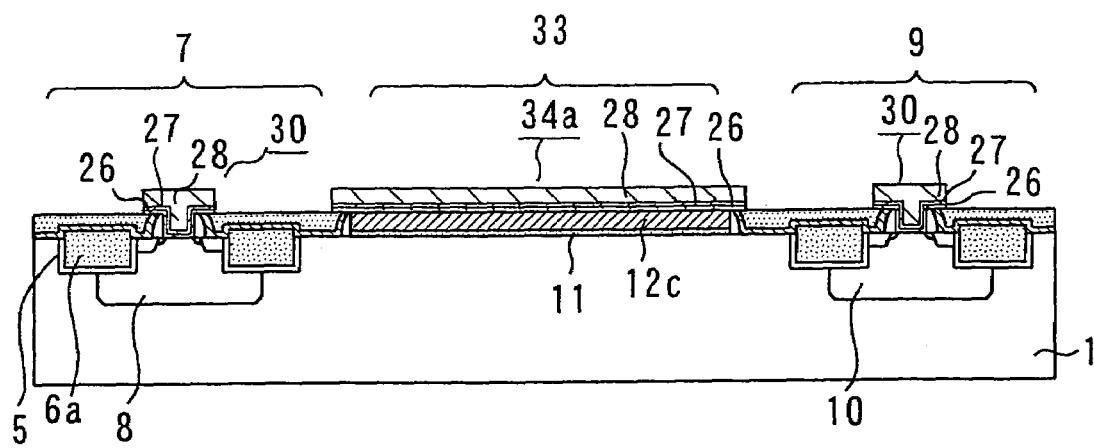
Figure 43:
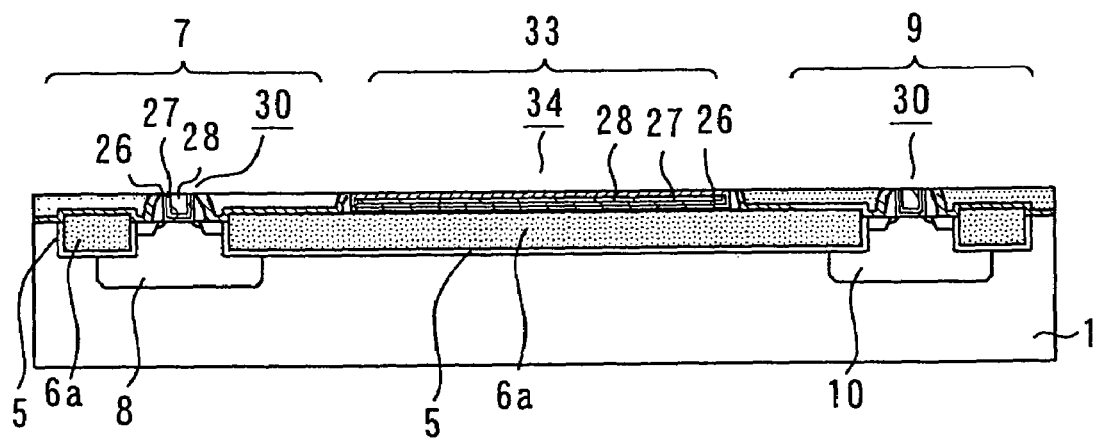
Figure 44:
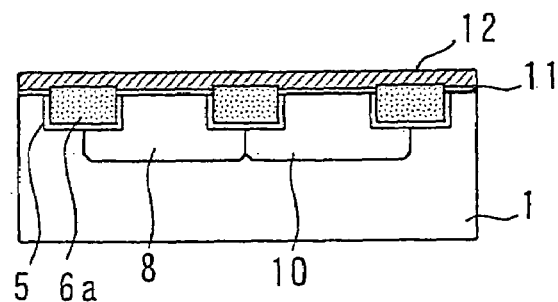
FIGS. 44 to 57 are process diagrams illustrating sequential steps of a conventional method for manufacturing a Damascene-type gate device and a replacing-type gate device.
Figure 45:
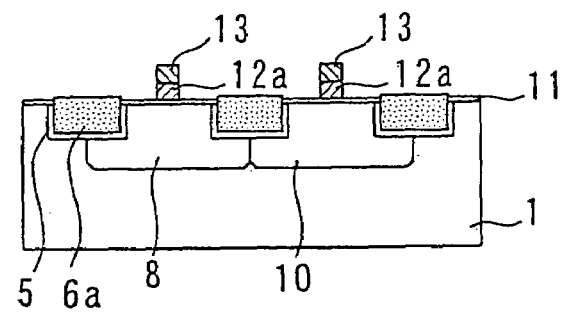
Figure 46:
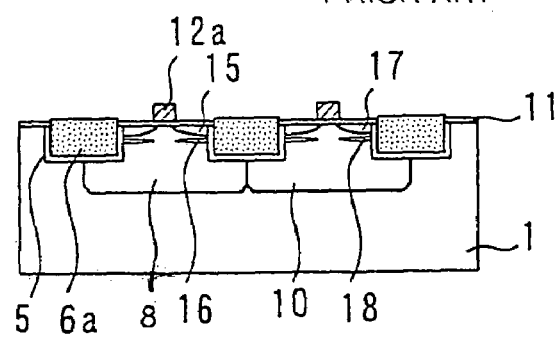
Figure 47:
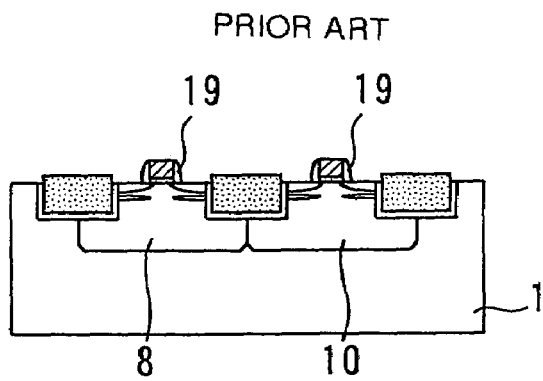
Figure 48:
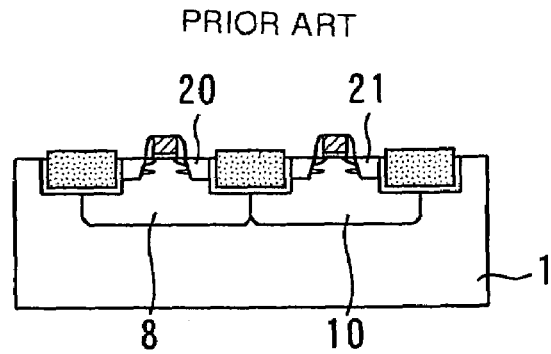
Figure 49:
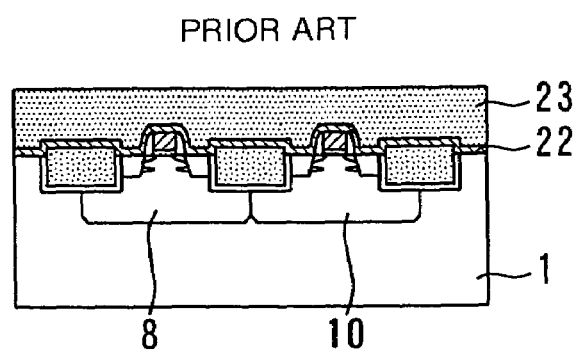
Figure 50:
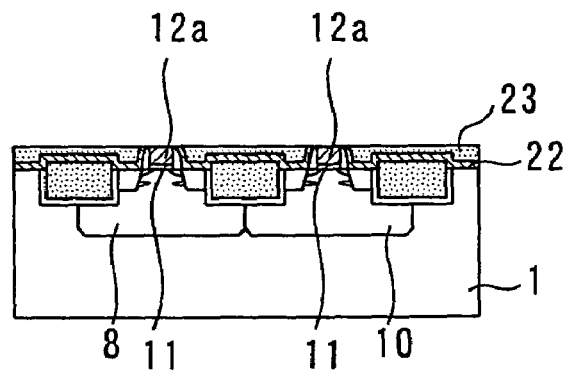
Figure 51:
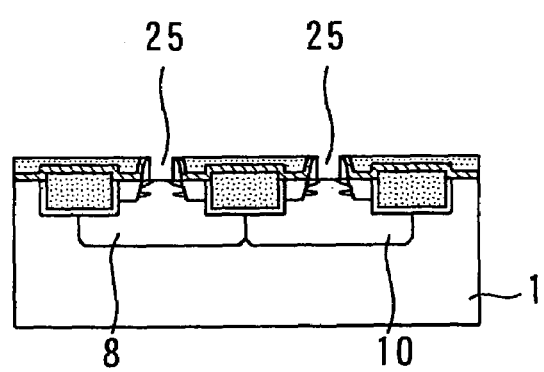
Figure 52:
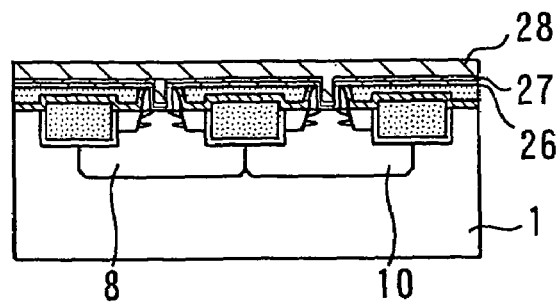
Figure 53:
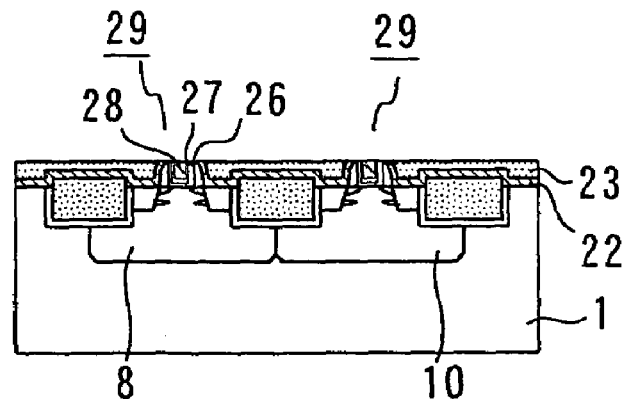
Figure 54:
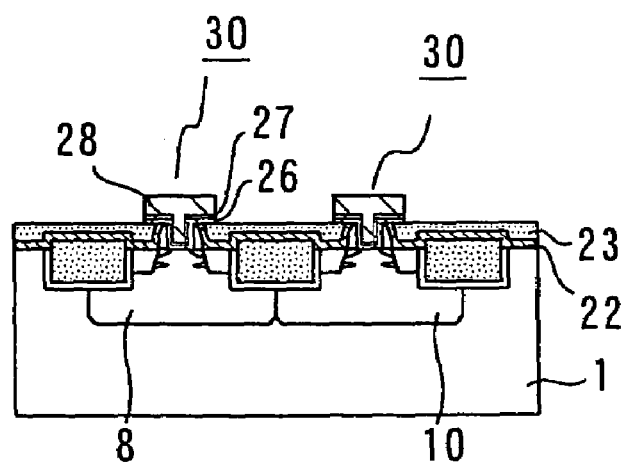
Figure 55:
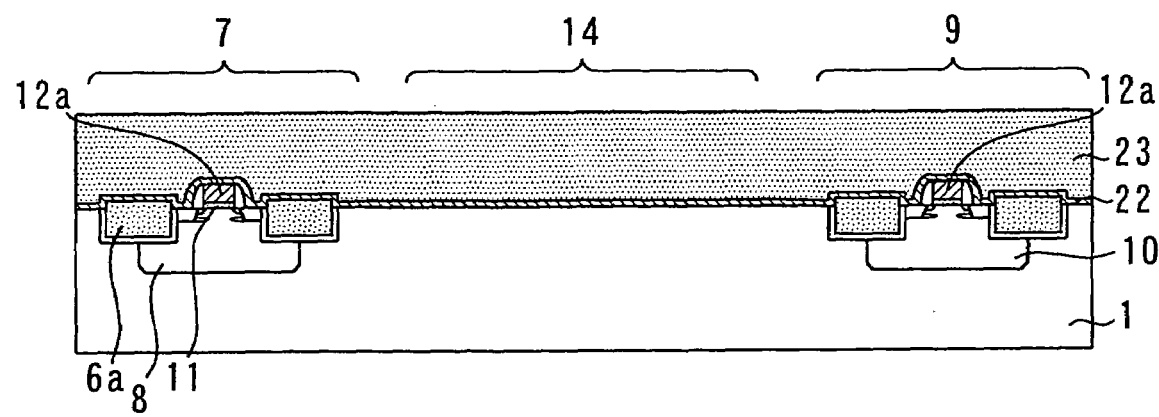

In this embodiment, as shown in FIG. 41 and FIG. 42, the analog circuit capacitor 34 or 34a is formed on the active region. However, as shown in FIG. 43, the capacitor 34 or 34a for the analog circuit may also be formed on the element isolation region 6a (field region). By forming a capacitor for the analog circuit on the element isolation region in this manner, noise resistance via the P-type silicon substrate 1 may be improved.

As described above, according to this embodiment, in a semiconductor device having a Damascene-type or replacing-type structure, unevenness of pattern density is avoided by arranging dummy gates in the positions where gates for transistors are formed for an internal circuit, and capacitor electrodes for the analog circuit on the region not used for the internal circuit.

Thereby, dishing produced in the CMP process for exposing the upper surfaces of the dummy gates is controlled. Thus, a semiconductor device without short-circuiting of wirings and change in interlayer capacitance in the Damascene-type gate can be obtained. Also obtained is a method for manufacturing such a semiconductor device that enables formation of good wirings in the Damascene-type gate forming step.

Furthermore, since the dummy pattern of the Damascene-type gate and the capacitor electrodes used in the analog circuit can be formed simultaneously, the processes may be simplified. Moreover, by forming a capacitor for the analog circuit on the element isolation region in this manner, noise resistance via the semiconductor substrate may be improved.

In order to avoid density difference of the Damascene-type gates or the replacing-type gates, electrodes used in the I/O circuit are arranged in the third embodiment, and electrodes of the capacitor for the analog circuit are arranged in the fourth embodiment. However, the electrodes arranged for eliminating the density difference of the Damascene-type gates or the replacing-type gates are not limited to these types, and electrodes of other circuit components may also be arranged.

Thus, according to the present invention, it is possible to obtain an excellent semiconductor device having a Damascene-type gate and a replacing-type gate and a manufacturing method thereof, wherein short-circuiting of wirings and change in interlayer capacitance is controlled.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2003-192418, filed on Jul. 4, 2003 including specification, claims, drawings and summary, on which the Convention priority of the present application is based, are incorporated herein by reference in its entirety.

What we claim is:

1. A semiconductor device comprising:
a plurality of semiconductor elements located in element-forming regions of a semiconductor substrate, said semiconductor elements having a Damascene gate structure or a replacing gate structure; and
a dummy pattern located in a region other than said element-forming regions, said dummy pattern having a gate structure made of materials different from the materials of said Damascene gate structure and said replacing gate structure.

2. The semiconductor device according to claim 1, wherein said dummy pattern includes an insulating film.

* * * * *